US009129933B2

(12) United States Patent
Yamamoto et al.

(10) Patent No.: US 9,129,933 B2
(45) Date of Patent: Sep. 8, 2015

(54) SEMICONDUCTOR MODULE AND AN INVERTER MOUNTING SAID SEMICONDUCTOR MODULE

(71) Applicant: SANYO ELECTRIC CO., LTD., Osaka (JP)

(72) Inventors: Tetsuya Yamamoto, Osaka (JP); Ryosuke Usui, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 4 days.

(21) Appl. No.: 14/092,322

(22) Filed: Nov. 27, 2013

(65) Prior Publication Data
US 2014/0077354 A1    Mar. 20, 2014

Related U.S. Application Data

(63) Continuation of application No. PCT/JP2012/004809, filed on Jul. 27, 2012.

(30) Foreign Application Priority Data

Jul. 29, 2011    (JP) ................................ 2011-167683

(51) Int. Cl.
*H01L 23/10*    (2006.01)
*H01L 23/34*    (2006.01)
(Continued)

(52) U.S. Cl.
CPC ........... *H01L 23/3675* (2013.01); *H02M 7/003* (2013.01); *H01L 2224/16225* (2013.01); *H01L 2224/48091* (2013.01); *H01L 2924/13062* (2013.01); *H01L 2924/13091* (2013.01)

(58) Field of Classification Search
CPC ................. H01L 2924/00; H01L 2224/73265; H01L 2224/32225

USPC ................................................... 257/707, 712
See application file for complete search history.

(56) References Cited

U.S. PATENT DOCUMENTS 6,845,012 B2 *    1/2005    Ohkouchi ..................... 361/704
7,547,966 B2 *    6/2009    Funakoshi et al. ............ 257/707
(Continued)

FOREIGN PATENT DOCUMENTS

JP    10-012812 A    1/1998
JP    2001-308263 A    11/2001
(Continued)

OTHER PUBLICATIONS

International Search Report issued in International Application No. PCT/JP2012/004809 mailed Sep. 4, 2012, with English translation, 2 pages.

*Primary Examiner* — Zandra Smith
*Assistant Examiner* — John M Parker
(74) *Attorney, Agent, or Firm* — McDermott Will & Emery LLP

(57) ABSTRACT

A semiconductor module has a first substrate and a second substrate placed opposite to the first substrate. A first semiconductor element is provided such that the high-heat main face of the first semiconductor faces the second substrate and is thermally connected to the second substrate via a wiring layer. A second semiconductor element is provided such that the high-heat main face of the second semiconductor faces the first substrate and is thermally connected to the first substrate via another wiring layer. The emitter electrode of the first semiconductor element and the collector electrode of the second semiconductor element are electrically connected to each other via a heat spreader.

9 Claims, 22 Drawing Sheets

(51) Int. Cl.
*H01L 23/367* (2006.01)
*H02M 7/00* (2006.01)

(56) References Cited

U.S. PATENT DOCUMENTS

| | | | | |
|---|---|---|---|---|
| 7,848,104 | B2* | 12/2010 | Shinohara | 361/695 |
| 8,450,845 | B2* | 5/2013 | Ikeda et al. | 257/712 |

| | | | |
|---|---|---|---|
| 2008/0224282 | A1 | 9/2008 | Ashida et al. |
| 2008/0224303 | A1 | 9/2008 | Funakoshi et al. |

FOREIGN PATENT DOCUMENTS

| | | |
|---|---|---|
| JP | 2007-281443 A | 10/2007 |
| JP | 2008-060529 A | 3/2008 |
| JP | 2008-124430 A | 5/2008 |
| JP | 2008-227131 A | 9/2008 |

\* cited by examiner

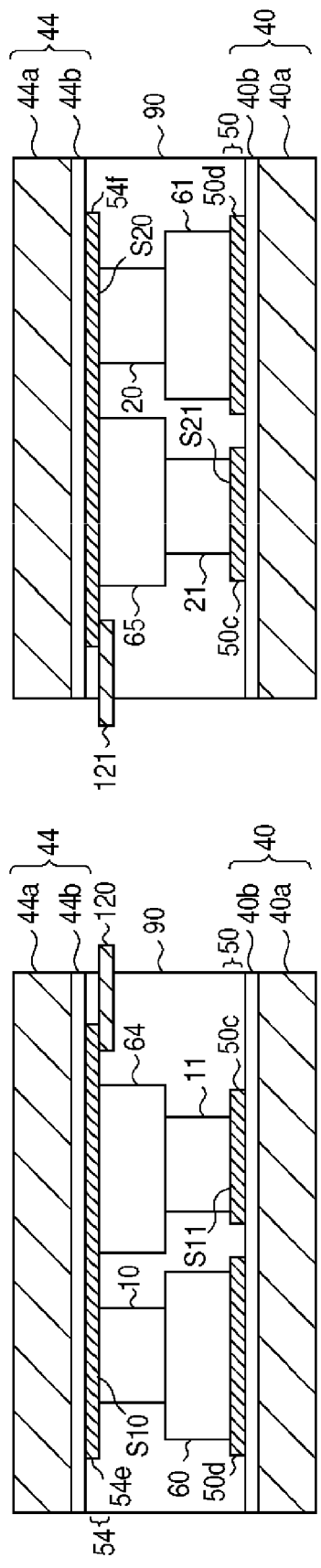

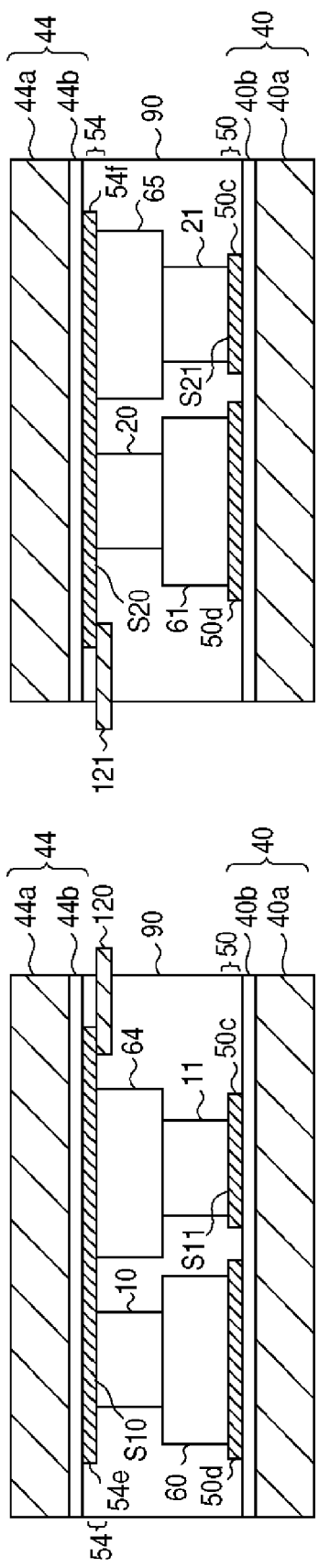
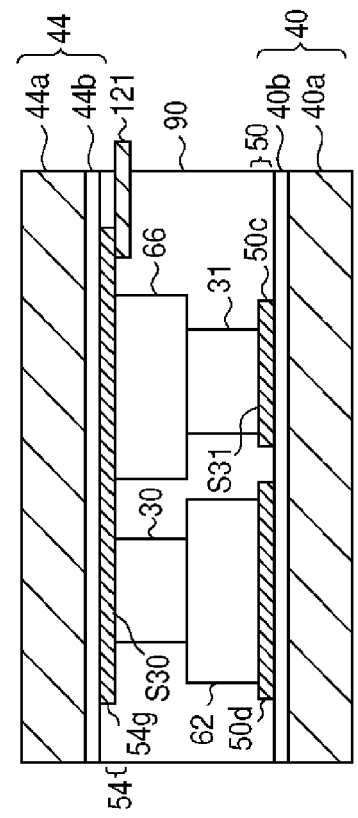
FIG. 11A
FIG. 11B

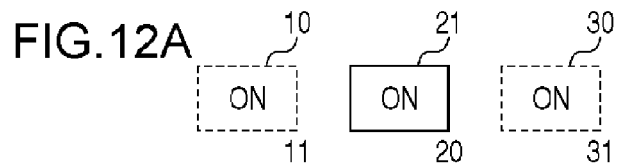
FIG.12A
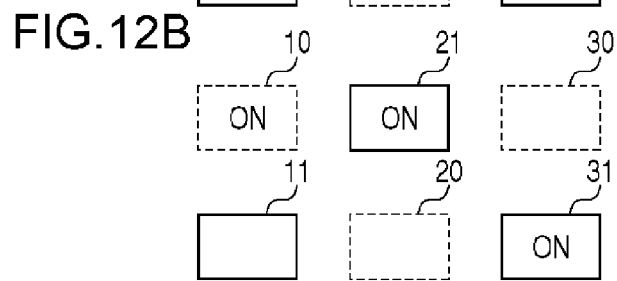
FIG.12B
FIG.12C
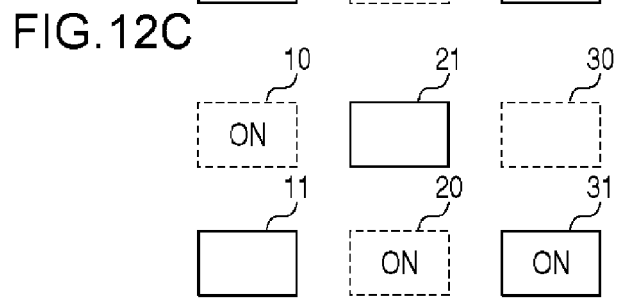
FIG.12D
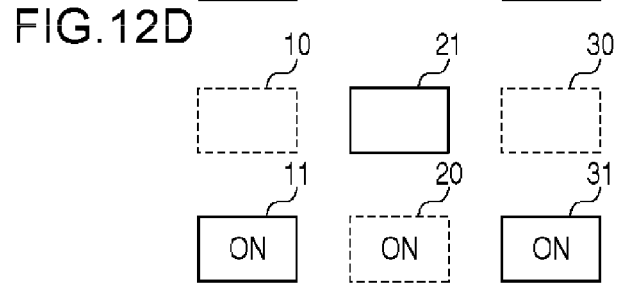
FIG.12E
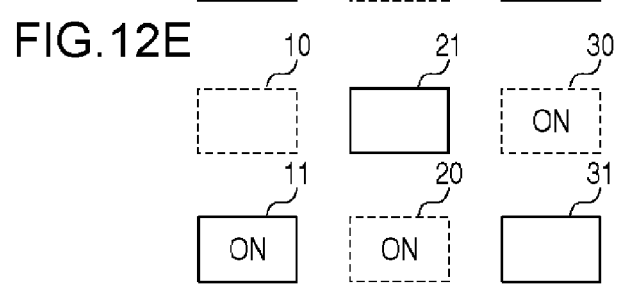
FIG.12F
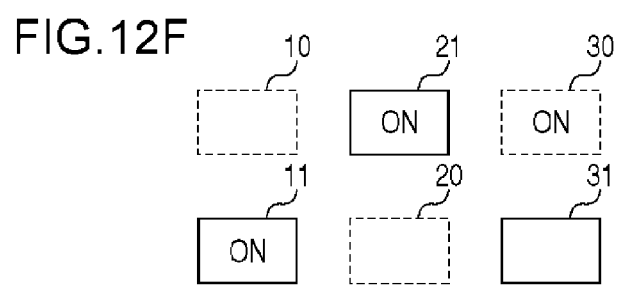

SEMICONDUCTOR MODULE AND AN INVERTER MOUNTING SAID SEMICONDUCTOR MODULE

RELATED APPLICATIONS

This application is a continuation of International Application No. PCT/JP2012/004809, filed on Jul. 27, 2012, which in turn claims the benefit of Japanese Application No. 2011-167683, filed on Jul. 29, 2011, the disclosures of which are incorporated by reference herein.

BACKGROUND OF THE INVENTION

1. Field of the Invention

The present disclosure relates to a semiconductor module and an inverter including said semiconductor module.

2. Description of the Related Art

In recent years, with miniaturization and higher performance in electronic devices, demand has been ever greater for further miniaturization of semiconductor modules used in the electronic devices. In order to meet such demand, disclosed is a semiconductor module where a plurality of semiconductor elements are mounted on a substrate at high density.

SUMMARY OF THE INVENTION

The temperature of each semiconductor element needs to be kept at a permitted value or below.

The present disclosure has been made in view of the foregoing circumstances, and one non-limiting and exemplary embodiment provides a technology that improves the heat radiation characteristics.

In one general aspect, the techniques disclosed here feature; a semiconductor module including: a first substrate; a second substrate disposed opposite to the first substrate at a predetermined interval; a first semiconductor element provided between the first substrate and the second substrate, wherein one main face of the first semiconductor element produces more heat than the other main face thereof; and a second semiconductor element provided between the first substrate and the second substrate, wherein one main face of the second semiconductor element produces more heat than the other main face thereof. The one main face of the first semiconductor element thermally connects to the first substrate, and the one main face of the second semiconductor element thermally connects to the second substrate.

Additional benefits and advantages of the disclosed embodiments will be apparent from the specification and Figures. The benefits and/or advantages may be individually provided by the various embodiments and features of the specification and drawings, and need not all be provided in order to obtain one or more of the same.

These general and specific aspects may be implemented using a system, a method, and a computer program, and any combinations of systems, methods, and computer programs.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 8A and FIG. 8B are schematic cross-sectional views of the respective phase arms in an inverter according to a third embodiment;

FIG. 11A and FIG. 11B are schematic cross-sectional views of respective phase arms of inverter according to a fourth embodiment;

FIG. 12A to FIG. 12F each shows the states of ON/OFF of respective semiconductor elements and the arrangement relations thereof when a three-phase AC is produced by an inverter according to a fourth embodiment;

DETAILED DESCRIPTION

Figure 1:
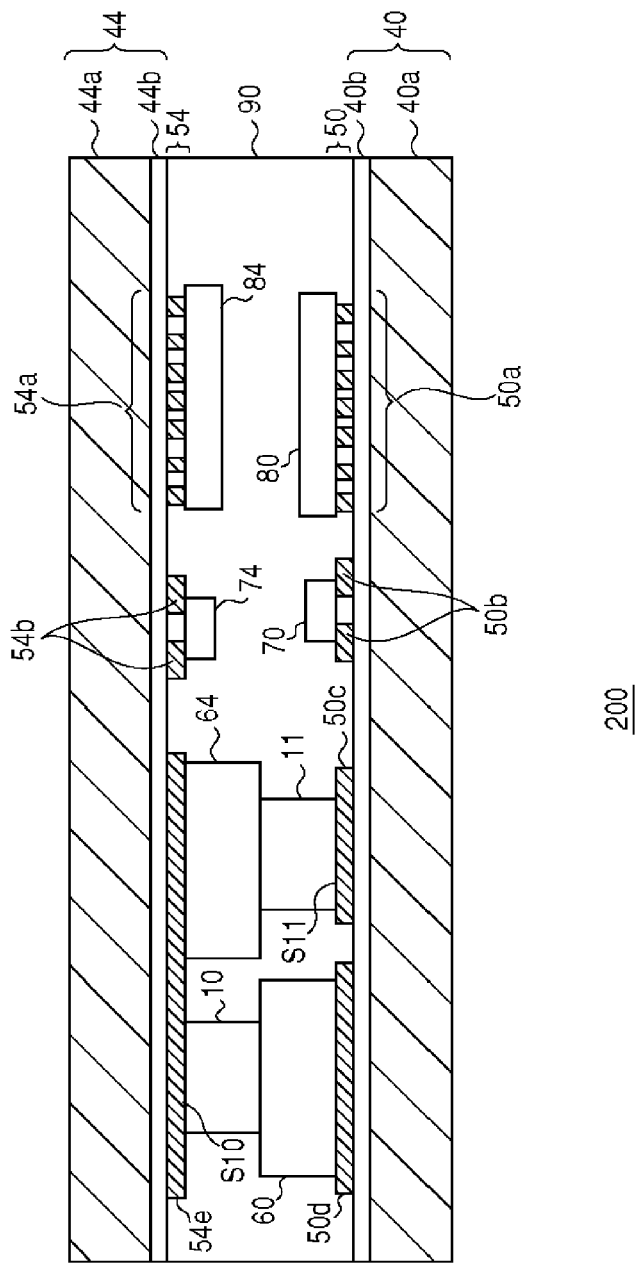
FIG. 1 is a schematic cross-sectional view of a semiconductor module according to a first embodiment.

The disclosure will now be described by reference to exemplary embodiments. This does not intend to limit the scope of the present disclosure, but to exemplify the disclosure.

Hereinafter, the exemplary embodiments, which represent a constructive reduction to practice of the present disclosure, will be described based on the accompanying drawings. The same or equivalent constituents illustrated in each drawing will be denoted with the same reference numerals, and the repeated description thereof will be omitted as appropriate.

The inventors' knowledge underlying the present disclosure will be explained before the exemplary embodiments of the present disclosure are explained in detail. In recent years, with miniaturization and higher performance in electronic devices, demand has been ever greater for further miniaturization of semiconductor modules used in the electronic devices. In order to meet such demand, disclosed is a semiconductor module where a plurality of semiconductor elements are mounted on a substrate at high density. The semiconductor element produces heat as a result of switching operations and the like. Along with the on-going sophistication of performance in the electronic devices, the amount of heat generated by the semiconductor element increases per unit volume. When the temperature of semiconductor elements exceeds a permitted value, the performance and reliability of semiconductor elements are adversely affected by the excess of temperature. In such a case, the heat produced thereby needs to be released outside so as to keep the temperature of semiconductor elements at or below the permitted value.

First Embodiment

FIG. 1 illustrates a schematic cross-section of a semiconductor module 200 according to a first embodiment. The semiconductor module 200 includes semiconductor elements 10 and 11, substrates 40 and 44, wiring layers 50 and 54, heat spreaders 60 and 64, passive elements 70 and 74, control circuit elements 80 and 84, and a molded resin 90.

A description is first given of a structure of the semiconductor module 200 on a substrate 40 side (bottom in FIG. 1).

The substrate 40 includes a metallic layer 40a and an insulating layer 40b.

The metallic layer 40a is a metallic substrate and is made of a metallic material, such as copper or aluminum, which excels in thermal conductivity. The thickness of the metallic layer 40a is about 1.5 mm, for instance.

The insulating layer 40b is formed on one main face (upper face in FIG. 1) of the metallic layer 40a. A material mainly composed of epoxy resin is used for the insulating layer 40b. The thickness of the insulating layer 40b is about 150 μm, for instance. In order to enhance the thermal conductivity, the insulating layer 40b may, for example, contain, as a high thermal conductive filler, silver, bismuth, copper, aluminum, magnesium, tin, zinc, an alloy of any two or more of those, or the like, silica, alumina, silicon nitride, aluminum nitride, or the like.

Wiring layers 50a, 50b, 50c and 50d, which are hereinafter generically referred to as "wiring layer 50" or "wiring layers 50" also, are provided on one main face (upper face in FIG. 1) of the substrate 40. The wiring layer 50 may be formed of a conductive material, such as a rolled metal or a rolled copper. The thickness of the wiring layer 50 is about 80 μm, for instance.

The heat spreader 60 is provided on top of the wiring layer 50d. A material, such as copper, which excels in heat conductivity and has a low electric resistance, is used for the heat spreader 60.

The semiconductor element 11 is a vertical transistor where one main face of the semiconductor element 11 produces more heat than the other main face thereof does. However, this should not be considered as limiting and, for example, the semiconductor element 11 may be a diode, an integrated circuit (IC) chip or the like.

The semiconductor element 11 is provided on top of the wiring layer 50c. The semiconductor element 11 has an emitter electrode and a gate electrode, both of which are not shown in FIG. 1, at one main face S11 (underside in FIG. 1) of the semiconductor element 11 and has a collector electrode (not shown) at the other main face thereof. The main face S11 of the semiconductor element 11, where the emitter electrode is provided, produces more heat than the other main face thereof does. And the main face S11 of the semiconductor element 11 faces the substrate 40 and thermally connects to the substrate 40. Accordingly, the heat produced in the main face S11 of the semiconductor element 11 is radiated to the substrate 44, too, through the medium of the heat spreader 64 and the wiring layer 54e but the heat generated from the main face S11 thereof is mainly radiated to the substrate 40.

The passive element 70 is mounted over one main face (upper face in FIG. 1) of the substrate 40 with the wiring layers 50b disposed between the passive element 70 and the substrate 40. That is, the passive element 70 is in contact with the wiring layers 50b. The passive element 70 is a capacitor, a resistor or the like.

The control circuit element 80 is mounted over the one main face (upper face in FIG. 1) of the substrate 40 with the wiring layers 50a disposed between the control circuit element 80 and the substrate 40. That is, the control circuit element 80 is in contact with the wiring layers 50a. The control circuit element 80, which is an integrated circuit (IC) or the like, controls the semiconductor element 11.

A description is now given of a structure of the semiconductor module 200 on a substrate 44 side (upper part in FIG. 1). The substrate 44 includes a metallic layer 44a and an insulating layer 44b. The substrate 44 is disposed counter to the substrate 40 at a predetermined interval between the substrate 44 and the substrate 40. Here, the predetermined interval is a distance determined by the thicknesses of the wiring layers 50 and 54, the heat spreaders 60 and 64, the semiconductor elements 10 and 11 and so forth, respectively, which are provided therebetween.

The metallic layer 44a and the insulating layer 44b are similar to the aforementioned metallic layer 40a and insulating layer 40b, respectively.

Wiring layers 54a, 54b and 54e, which are hereinafter generically referred to as "wiring layer 54" or "wiring layers 54" also, are provided on one main face (underside in FIG. 1) of the substrate 44.

The wiring layer 54e is provided in a position opposite to the wiring layers 50c and 50d. Though, in the present embodiment, the wiring layers 54a and 54b are also provided in the positions opposite to the wiring layers 50a and 50b, respectively, the wiring layers 54a and 54b may be provided in positions not exactly aligned with the positions of the wiring layers 50a and 50b. The wiring layer 54 may be formed of the same material as that of the wiring layer 50, and the thickness of the wiring layer 54 may be the same as that of the wiring layer 50.

The heat spreader 64 is provided in a surface of the wiring layer 54e and is provided in a position opposite to the wiring layer 50c. Also, "one main face of the heat spreader 64" is in contact with one main face of the semiconductor element 11 opposite to the main face S11 thereof. Here, the "one main face of the heat spreader 64" is one main face thereof opposite to a face in contact with the wiring layer 54e. Thus, the collector electrode of the semiconductor element 11 is electrically connected to the wiring layer 54e through the medium of the electrically conductive heat spreader 64. In other words, the heat spreader 64 is disposed between the wiring layer 54e and the semiconductor element 11, and is in contact with both of them. The material used for the heat spreader 64 is the same as that used for the heat spreader 60.

The semiconductor element 10 is provided in the surface of the wiring layer 54e. The semiconductor element 10 is a semiconductor element similar to the semiconductor element 11. Similar to the semiconductor element 11, the semiconductor element 10 has an emitter electrode and a gate electrode, both of which are not shown in FIG. 1, at one main face S10 (upper face in FIG. 1) of the semiconductor element 10 and has a collector electrode (not shown) at the other main face thereof. And the main face S10 of the semiconductor element 11, having the emitter electrode and a larger heat generation rate, faces the substrate 44 and thermally connects to the substrate 44. The opposite main face thereof is in contact with the heat spreader 60. The heat produced in the main face S10 of the semiconductor element 10 is radiated to the substrate 40, too, through the medium of the heat spreader 60 and the wiring layer 50d but the heat generated from the main face S10 thereof is mainly radiated to the substrate 44. The main face S10 thereof, namely the emitter electrode of the semiconductor element 10, is in direct contact with the wiring layer 54e.

The passive element 74 and the control circuit element 84 are elements corresponding respectively to the aforementioned passive element 70 and control circuit element 80. The passive element 74 and the control circuit element 84 are mounted over one main face (underside in FIG. 1) of the substrate 44 with the wiring layers 54b and 54a disposed between those 74 and 84 and the substrate 44. That is, the passive element 74 and the control circuit element 84 are in contact with the wiring layers 54b and 54a, respectively.

The structural features as described above may be summarized as follows. The semiconductor element 10 is provided such that the main face S10 of the semiconductor element 10 faces the substrate 44. The semiconductor element 11 is provided such that the main face S11 of the semiconductor element 11 faces the substrate 40. In other words, the semiconductor elements 10 and 11 are configured such that the main faces of the semiconductor elements 10 and 11 each having a larger heat generation rate face mutually different substrates and are thermally connected to the substrates facing the respective main faces. Hereinafter, the main face thereof that produces more heat than the other face thereof will be referred to as "high-heat main face" also. The emitter electrode of the semiconductor element 10 is in direct contact with the wiring layer 54e, and the collector electrode of the semiconductor element 11 is electrically connected to the wiring layer 54e through the medium of the heat spreader 64. That is, the emitter electrode of the semiconductor element 10 and the collector electrode of the semiconductor element 11 are electrically connected to each other through the medium of the heat spreader 64.

(Fabrication Method)

FIG. 2A to FIG. 2D are cross-sectional views showing a process for fabricating a semiconductor module according to the first embodiment as shown in FIG. 1.

Figure 2A:
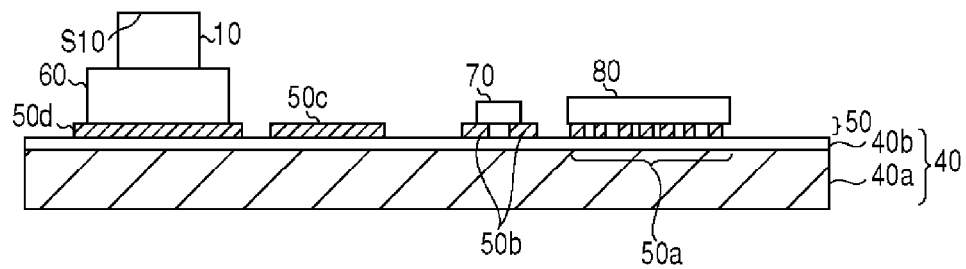
FIG. 2A to FIG. 2D are cross-sectional views showing a process for fabricating a semiconductor module according to a first embodiment.

As illustrated in FIG. 2A, prepared is a substrate 40 where an insulating layer 40b whose thickness is about 150 μm is formed on top of a metallic layer 40a whose thickness is about 1.5 mm. Then a wiring layer 50 is patterned by using a known photolithography technique and a known etching technique. A control circuit element 80, a passive element 70 and a heat spreader 60 are mounted on top of wiring layers 50a, 50b and 50d, respectively. A semiconductor element 10 is further mounted on the heat spreader 60 so as to flip-chip connect the wiring layer 50d, the heat spreader 60 and the semiconductor element 10.

Figure 2B:
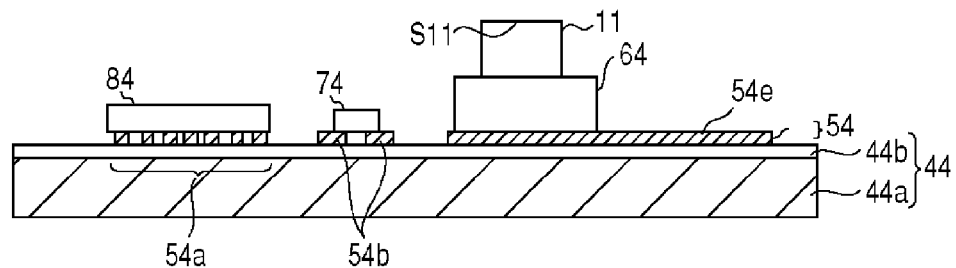

Similarly, as illustrated in FIG. 2B, prepared is a substrate 44 where an insulating layer 44b whose thickness is about 150 μm is formed on top of a metallic layer 44a whose thickness is about 1.5 mm. Then, similar to the substrate 40, a wiring layer 54 is patterned. Similar to the substrate 40, a control circuit element 84, a passive element 74 and a heat spreader 64 are connected to wiring layers 54a, 54b and 54e, respectively. A semiconductor element 11 is further connected to the heat spreader 64.

Figure 2C:
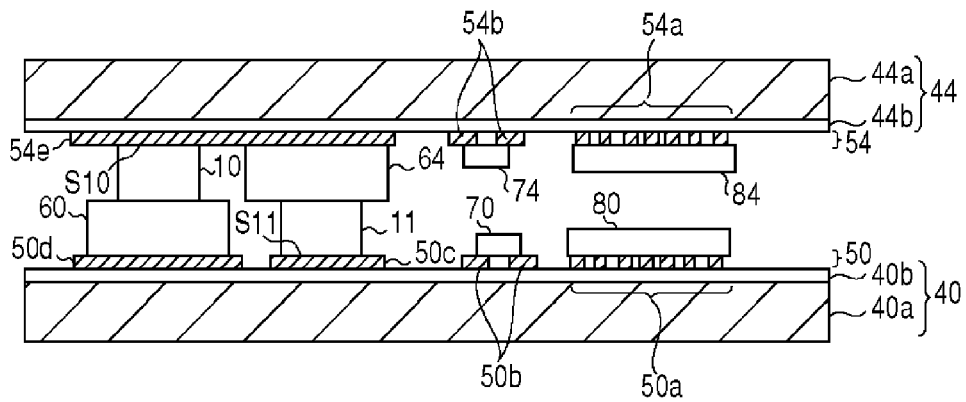

Then, as illustrated in FIG. 2C, the substrate 44 is turned over. And the substrate 44 is placed and stacked on the substrate 40 to enable the flip-chip connection in a manner such that the main face S10 of the semiconductor element 10 is in contact with the wiring layer 54e and such that the main face S11 of the semiconductor element 11 is in contact with the wiring layer 50c.

Figure 2D:
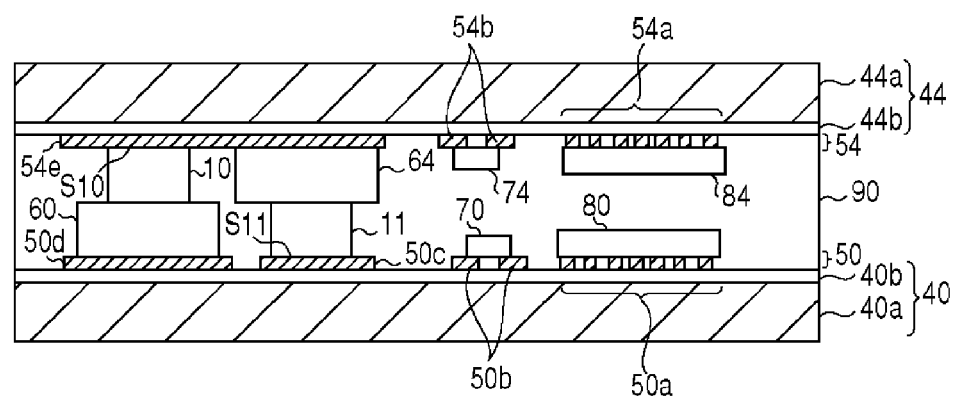

Then, as illustrated in FIG. 2D, those components placed between the substrate 44 and the substrate 40 are sealed with the molded resin 90. This process can be achieved by transfer molding, injection molding, potting or dipping. As a resin material as used herein, a thermosetting resin such as epoxy resin may be transfer-molded or potted. Also, a thermoplastic resin such as polyimide resin or polyphenylene sulfide may be injection-molded.

Through these processes, a semiconductor module according to the first embodiment, as shown in FIG. 1, is manufactured.

Comparative Example 1

Figure 3:
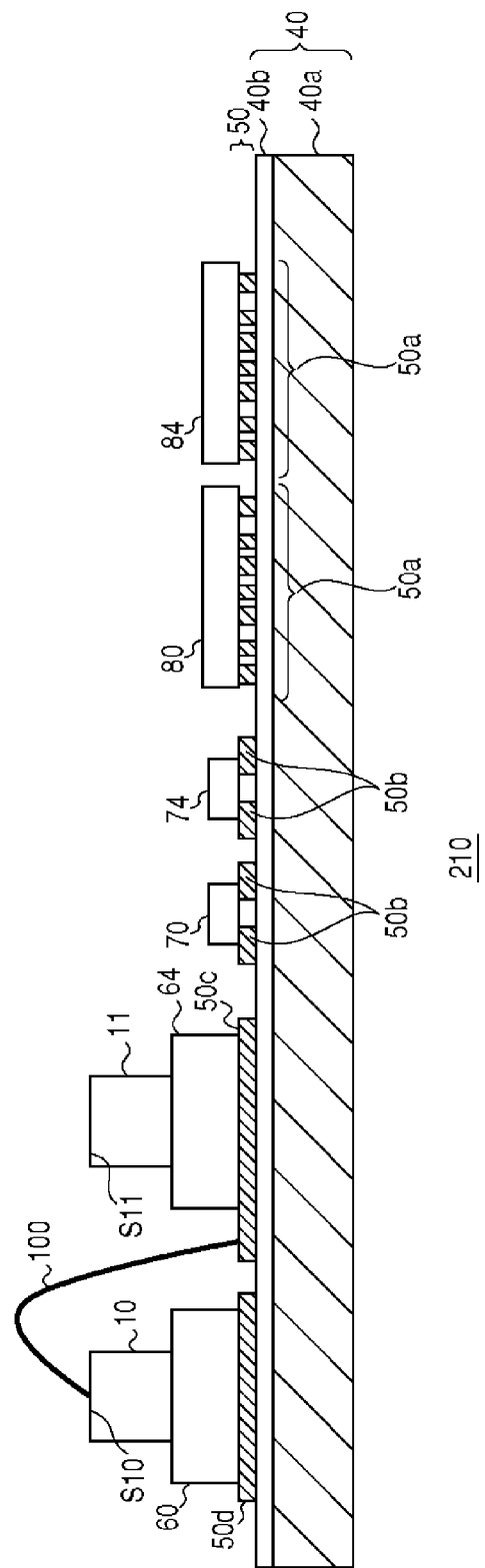
FIG. 3 is a schematic cross-sectional view of a semiconductor module, according to comparative example 1, to be compared with that of the first embodiment.

FIG. 3 shows a semiconductor module 210, according to comparative example 1, to be compared with that of the first embodiment. Compared with FIG. 1, comparative example 1 shown in FIG. 3 is comprised of a single substrate 40 only. Also, the semiconductor elements 10 and 11 are configured such that their respective main faces only (which produce less heat than the other faces thereof) opposite to the main faces S10 and S11 are thermally connected to the substrate 40. Also, the not-shown emitter electrode of the semiconductor element 10 and the not-shown collector electrode of the semiconductor element 11 are electrically connected to each other using a wire bonding 100. Also, the semiconductor module 210 is constituted by a single substrate 40 and therefore the passive element 74 and the control circuit element 84 are consequently mounted to the substrate 40.

Comparative Example 2

Figure 4:
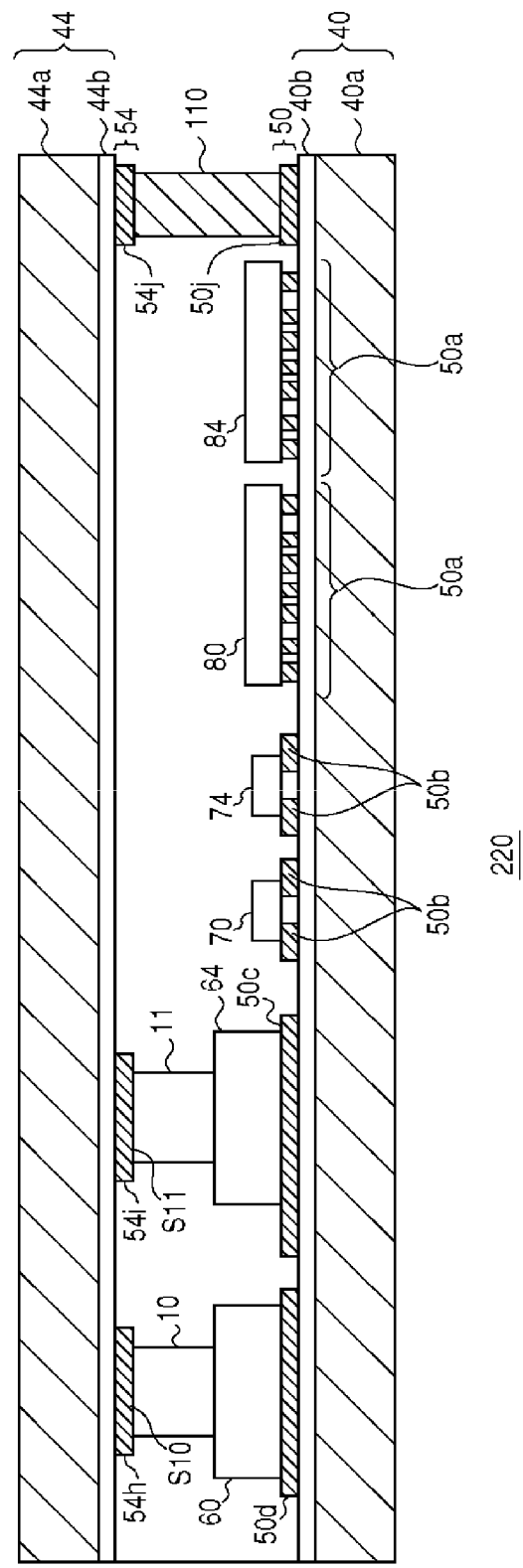
FIG. 4 is a schematic cross-sectional view of a semiconductor module, according to comparative example 2, to be compared with that of the first embodiment.

FIG. 4 shows a semiconductor module 220, according to comparative example 2, to be compared with that of the first embodiment. Compared with FIG. 1, the semiconductor elements 10 and 11 of the comparative example 2 shown in FIG. 4 are configured such that both the main faces S10 and S11, which are their respective high-heat main faces, face the substrate 44 and are thermally connected to the substrate 44. Also, the semiconductor element 10 is provided such that the main face S10 having the emitter electrode is in direct contact with a wiring layer (wiring layer 54h) on the substrate 44. Similarly, the semiconductor element 11 is provided such that the main face S11 having the emitter electrode is in direct contact with a wiring layer (wiring layer 54i) on the substrate 44. In other words, the respective main faces of the semiconductor elements 10 and 11 each having the emitter electrode face the same substrate. Equivalently, the main face of one of the semiconductor elements having the emitter electrode and the main face of the other thereof having the collector electrode do not face the same substrate. In order to electrically connect them, therefore, a path 110, which connects the wiring layer 50 of the substrate 40 and the wiring layer 54 of the substrate 44, is so provided as to be in contact with wiring layers 50j and 54j. Also, the passive element 74 and the control circuit element 84 are mounted to the substrate 40.

Based on a comparison of the present embodiment with the above-described comparative examples 1 and 2, advantageous effects of the present embodiment will now be described. By employing the first embodiment, the two semiconductor elements are provided such that the respective high-heat main thereof face mutually different substrates and are thermally connected to the substrates facing the respective main faces. Thus, the heat produced by the semiconductor elements can be efficiently radiated to the exterior from the two substrates, as compared with the configuration as in the comparative example 1 where the high-heat main faces are not thermally connected to the substrate and that as in the comparative example 2 where the high-heat main faces of the two semiconductor elements face the same substrate and are thermally connected to the same substrate. Hence, the heat release performance of the semiconductor module according to the present embodiment can be enhanced.

Also, the electrodes of the two semiconductor elements are electrically connected via the wiring layer and the heat spreader. This eliminates provision of the wiring by the wire bonding, as in the comparative example 1, and the path connecting the two substrates, as in the comparative example 2, thereby simplifying the manufacturing processes. Also, the space otherwise necessary for the leading of the wirings by the wire bonding as in the comparative example 1 is no longer necessary. Thus, the semiconductor module can be downsized.

Also, in the present embodiment, the passive element 70 and the control circuit element 80 are placed in the regions opposite to the passive element 74 and the control circuit element 84, respectively. This can reduce the overall size of the semiconductor module as compared with the comparative examples 1 and 2 where the passive elements 70 and 74 and the control circuit elements 80 and 84 are placed over a single substrate.

Second Embodiment

Figure 5:
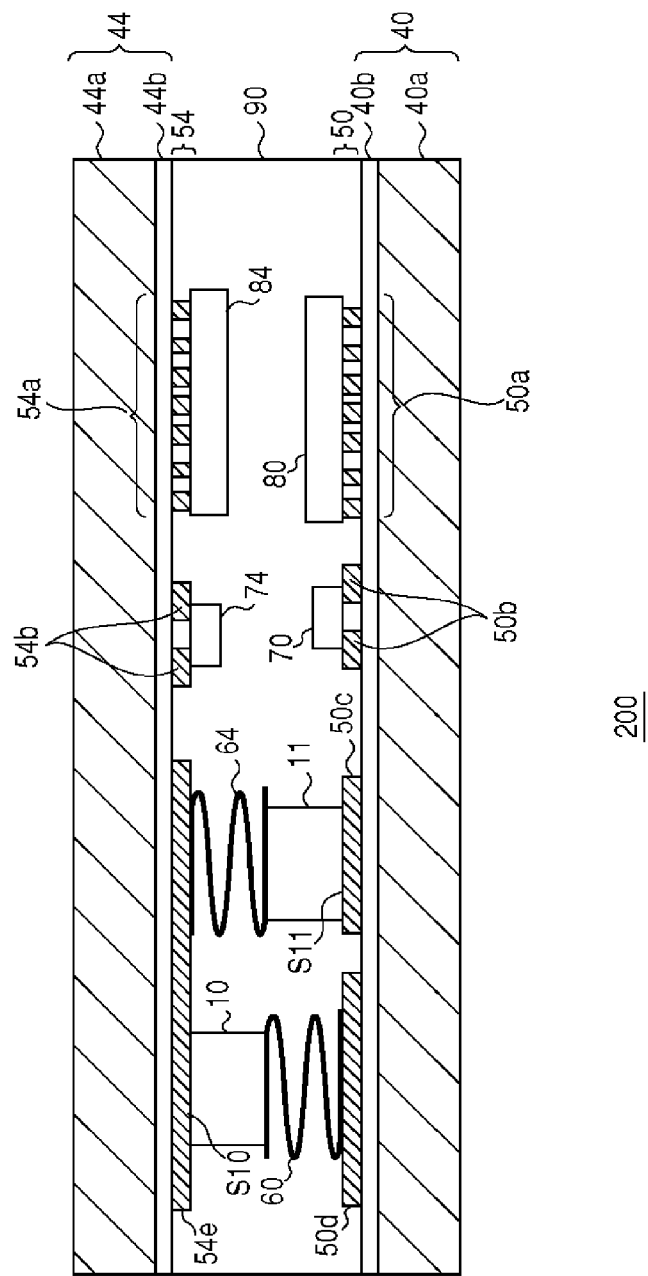
FIG. 5 is a schematic cross-sectional view of a semiconductor module according to a second embodiment.

FIG. 5 shows a schematic cross-section of a semiconductor module according to a second embodiment. What differs from the first embodiment is as follows. Copper plates 60 and 64, which are each bent into a bellows-like shape, are used as the heat spreaders 60 and 64. In other words, the heat spreaders 60 and 64 are used as elastic bodies.

The process for fabricating a semiconductor module according to the second embodiment is basically the same as that for fabricating a semiconductor module according to the first embodiment. The fabrication process in the second embodiment only differs in the following respect. That is, when the substrate 44 is turned over and then the substrate 44 is stacked on the substrate 40 to perform a flip-chip connection, the flip-chip connection is formed while the substrate 40 and the substrate 44 are pressed together in such a manner that the elastic forces of the heat spreaders 60 and 64 act on the semiconductor elements and the wiring layers.

The second embodiment achieves the advantageous effects similar to those achieved by the first embodiment. In addition to the similar effects, the semiconductor elements and the wiring layers can be connected in a manner such that no spaces is created between the semiconductor elements and the wiring layers. This is because the semiconductor elements and the wiring layer are connected while the elastic forces of the heat spreaders act on them. More specifically, the semiconductor elements and the wiring layers can be electrically and thermally connected to each other in a reliable manner.

Third Embodiment

Figure 6:
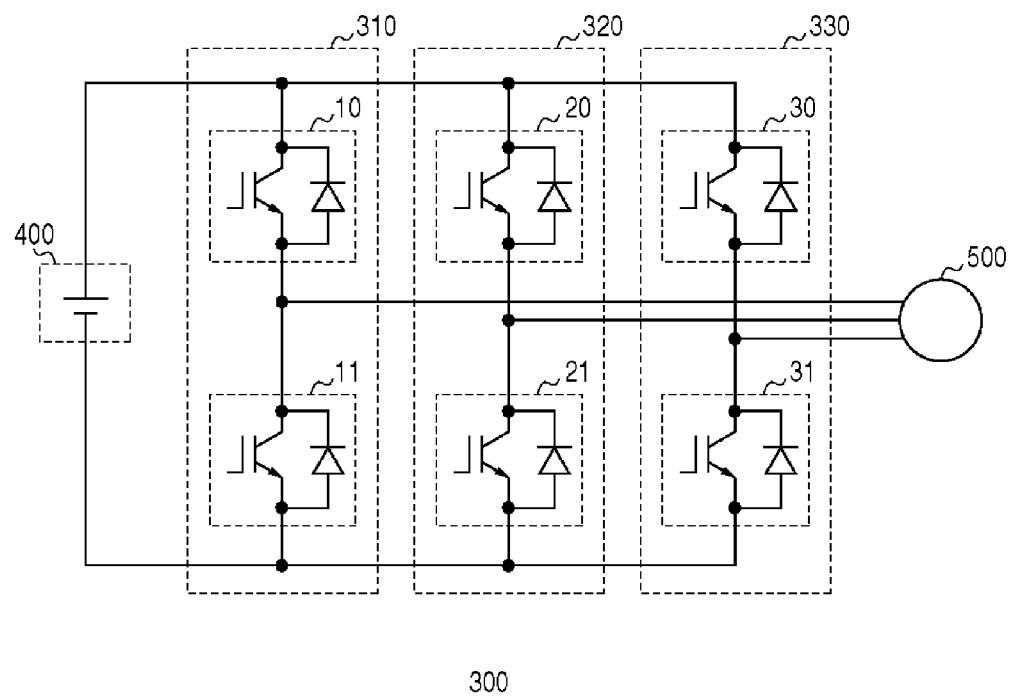
FIG. 6 is a circuit diagram showing a circuit configuration of an inverter according to a third embodiment.

FIG. 6 shows a circuit configuration of an inverter 300 using a semiconductor module according to a third embodiment. The inverter 300, which is a three-phase inverter, includes a U-phase arm 310, a V-phase arm 320, and a W-phase arm 330. The U-phase arm 310, the V-phase arm 320, and the W-phase arm 330 are provided in parallel with each other between a power-supply line and a ground line. For the ease of explanation, a power supply 400 and a load 500 are also depicted in FIG. 1 but the power supply 400 and the load 500 are not included in the structural components of the inverter 300.

The U-phase arm 310 is comprised of semiconductor elements 10 and 11 connected in series with each other in between the power-supply line and the ground line. Similarly, the V-phase arm 320 is comprised of semiconductor elements 20 and 21 connected in series with each other, and the W-phase arm 330 is comprised of semiconductor elements 30 and 31 connected in series with each other. In the present embodiment, each of the semiconductor elements 10 to 31 is a vertical transistor unless otherwise specified in particular.

Figure 7:
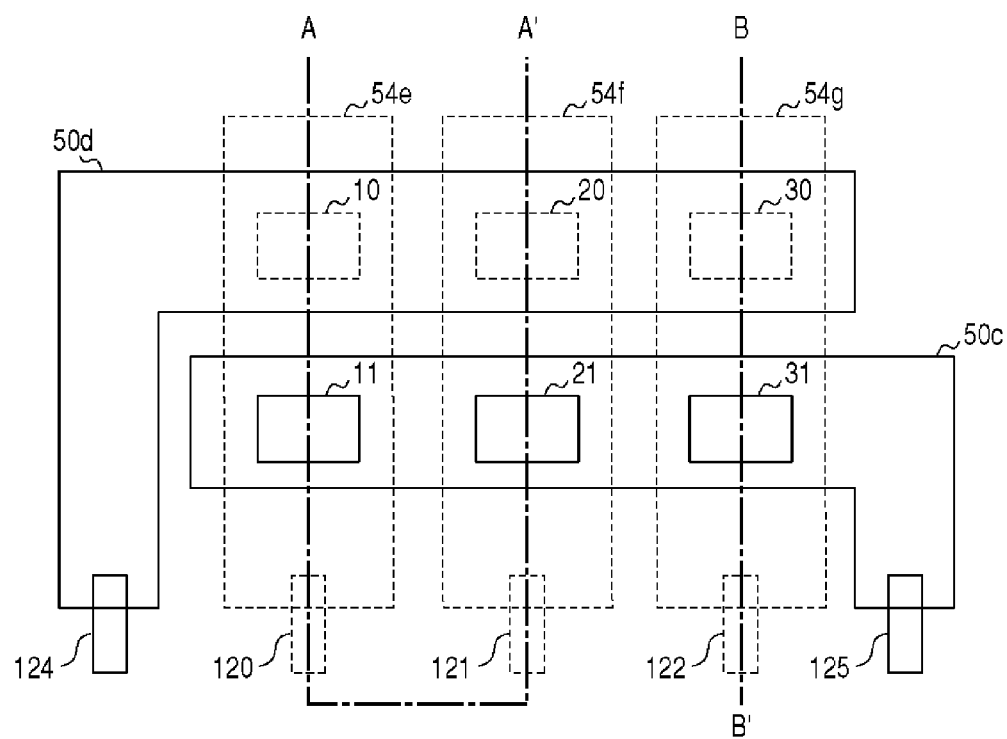
FIG. 7 is a diagram showing a wiring of inverter and an arrangement of semiconductor elements according to a third embodiment.

FIG. 7 shows a wiring of the inverter 300 and an arrangement of semiconductor elements. In FIG. 7, wiring layers 54f and 54g are the wiring layers included in the wiring layer 50 and correspond to the wiring layer 54e. Of the wiring layers 50 and 54, the wiring layers indicated using solid lines are provided in the substrate 40 (not shown in FIG. 7), and those indicated using dotted lines are provided in the substrate 44 (not shown in FIG. 7). More specifically, the wiring layers 50c and 50d are provided in the substrate 40, and the wiring layers 54e to 54g are provided in the substrate 44. Of semiconductor elements 10 to 31, the semiconductor elements indicated by solid lines are those, in which the high-heat main faces thereof face the substrate 40, and are thermally connected to the substrate 40. And the semiconductor elements indicated by dotted lines are those, in which the high-heat main faces thereof face the substrate 44, and are thermally connected to the substrate 44. More specifically, the semiconductor elements 10, 20 and 30 face the substrate 44 and are thermally connected to the substrate 44, and the semiconductor elements 11, 21 and 31 face the substrate 40 and are thermally connected to the substrate 40. In FIG. 7, a U-phase terminal 120, a V-phase terminal 121 and a W-phase terminal 122 are a U-phase output terminal, a V-phase output terminal, and a W-phase output terminal, respectively.

FIG. 8A and FIG. 8B show schematic cross-sections of the respective phase arms in an inverter 300. FIG. 8A is a schematic cross section, taken along the line A-A' of FIG. 7, including the U-phase arm and the V-phase arm. FIG. 8B is a schematic cross section, taken along the line B-B' of FIG. 7, including the W-phase arm. Main faces S20, S21, S30 and S31 indicate the high-heat faces of the semiconductor elements 20, 21, 30 and 31, respectively. As shown in FIGS. 8A and 8B, two semiconductor elements included in each phase arm are configured such that the high-heat main faces of the two semiconductor elements face mutually different substrates and are thermally connected thereto. Heat spreaders 61 and 62 correspond to the heat spreader 60, and heat spreaders 65 and 66 correspond to the heat spreader 64. Also, the wiring layers 54f and 54g correspond to the wiring layer 54e. The wiring layer 54f electrically connects the semiconductor element 20 and the semiconductor element 21, and the wiring layer 54g electrically connects the semiconductor element 30 and the semiconductor element 31. The U-phase terminal 120, the V-phase terminal 121 and the W-phase terminal 122, which are terminals used to connect to an external load 500 (not shown in FIGS. 8A and 8B), are in direct contact with the wiring layers 54e, 54f and 54g, respectively. Note that the passive element and the control circuit element as shown in FIG. 1 of the first embodiment are omitted in FIGS. 8A and 8B.

Figure 9A:
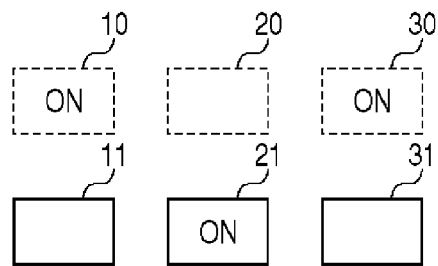
FIG. 9A to FIG. 9F each shows the states of ON/OFF of respective semiconductor elements and the arrangement relations thereof when a three-phase alternate current (AC) is produced by an inverter according to a fourth embodiment.
Figure 9B:
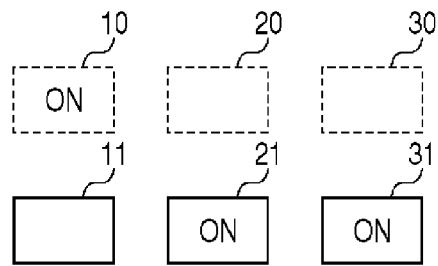
Figure 9C:
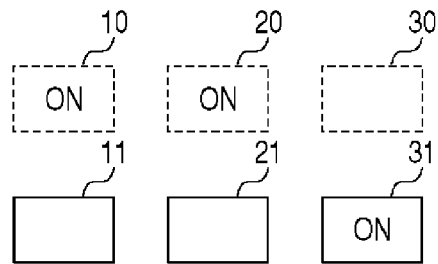
Figure 9D:
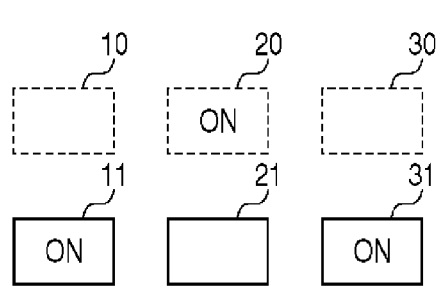
Figure 9E:
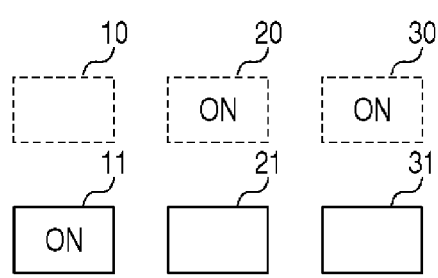
Figure 9F:
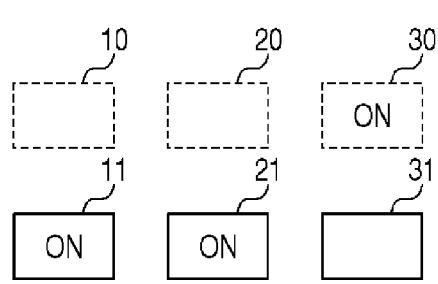

FIG. 9A to FIG. 9F each shows the states of ON/OFF of respective semiconductor elements and the arrangement relations thereof when a three-phase alternate current (AC) is produced by the inverter 300. The semiconductor elements 10 to 31 indicated by the solid lines and the dotted lines in FIG. 9A to FIG. 9F are expressed the same way as FIG. 7. A not-shown control unit has the inverter 300 generate the three-phase AC in such a manner that the states of the respective semiconductor elements 10 to 31 are sequentially switched from the ON/OFF states as indicated in FIG. 9A up to the ON/OFF states as indicated in FIG. 9F. Note that two semiconductor elements included in each phase arm are provided such that the high-heat main faces of the two semiconductor elements face mutually different substrates. It is, therefore, evident from FIG. 9A to FIG. 9F that (1) the high-heat main faces of the semiconductor elements facing the substrate 40 and (2) the high-heat main faces of the semiconductor elements facing the substrate 44 are equally switched on between (1) and (2).

A description is now given of the flow of current in the above-described configuration using an exemplary case of ON/OFF states shown in FIG. 9A, namely the case where the semiconductor elements 10, 21 and 30 are switched on and the semiconductor elements 11, 20 and 31 are switched off.

A description is first given of a general flow of current using FIG. 6. The current supplied from the power supply 400 flows to the load 500 through the semiconductor element 10. Similarly, the current from the power supply 400 flows to the load 500 through the semiconductor element 30. The current delivered to the load 500 returns to the power supply 400 through the semiconductor element 21.

A detailed description is next given of the flow of current with reference to FIGS. 8A and 8B. The current from the power supply 400 (not shown in FIGS. 8A and 8B) flows into the wiring layer 50d of FIG. 8A through an input terminal 124 (not shown in FIGS. 8A and 8B). Then the current flows into the wiring layer 54e through the semiconductor element 10 and flows out to the load 500 (not shown in FIGS. 8A and 8B) through the U-phase terminal 120. Similarly, the current from the power supply 400 flows into the wiring layer 54g through the semiconductor element 30 of FIG. 8B and then flows out to the load 500 through the W-phase terminal 122. The current, which has flowed to the load 500 through the semiconductor elements 10 and 30, flows into the wiring layer 54f through the V-phase terminal 121 of FIG. 8A. Then the current flows into the wiring layer 50c through the semiconductor element 21 and returns to the power supply 400 through an output terminal 125 (not shown in FIGS. 8A and 8B).

By employing the third embodiment, two semiconductor elements included in each phase arm are provided such that the high-heat main faces of the two semiconductor elements face mutually different substrates and are thermally connected thereto. Thus, the heat produced by the semiconductor elements can be efficiently radiated to the exterior from the respective substrates. As a result, the heat release performance of the inverter can be enhanced.

Fourth Embodiment

Figure 10:
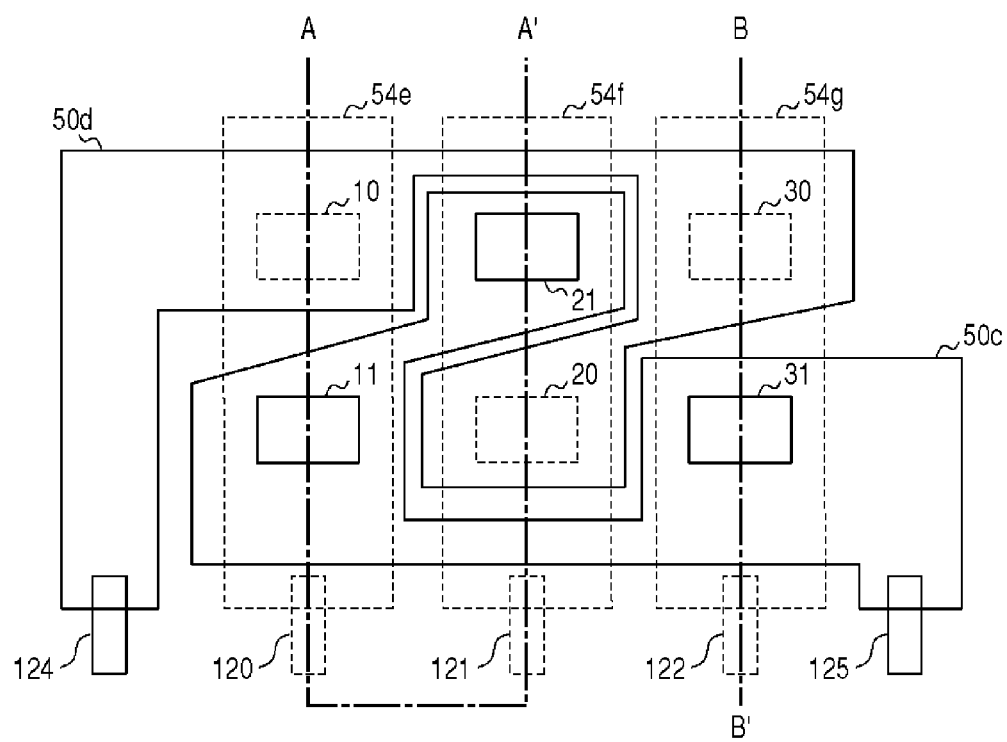
FIG. 10 is a diagram showing a wiring of inverter and an arrangement of semiconductor elements according to a fourth embodiment.

FIG. 10 shows a wiring of the inverter 300 and an arrangement of semiconductor elements according to a fourth embodiment. FIG. 11A and FIG. 11B shows schematic cross-sections of respective phase arms of the inverter 300 according to the fourth embodiment. FIG. 10, FIG. 11A and FIG. 11B correspond to FIG. 7, FIG. 8A and FIG. 8B. What differs from the third embodiment is as follows. The arrangement of the semiconductor element 20 and the semiconductor element 21 in the third embodiment is reversed in the fourth embodiment, and the shapes of the wiring layer 50c and the wiring layer 50d in fourth embodiment differ from those in the third embodiment.

As shown in FIG. 10, the semiconductor elements are configured such that the high-heat main face of each semiconductor element, including semiconductor elements of different phases, faces a substrate that differs from the substrate that its adjacent semiconductor elements face, and are thermally connected thereto. For example, as shown in FIG. 10, the V-phase semiconductor element 21 is configured such that the high-heat main face thereof faces the substrate 40 and is thermally connected thereto. On the other hand, the semiconductor element 20 of the same V-phase is configured such that the high-heat main face thereof faces the substrate 44 and is thermally connected thereto. Also, the semiconductor elements 10 and 30, which are of U-phase and W-phase, respectively, and are positioned adjacent to the semiconductor element 21, are configured such that the high-heat main faces thereof face the substrate 44 and are thermally connected thereto.

Also, as shown in FIG. 11, the wiring layers 50c and 50d are formed such that the electrical connection relationship between the semiconductor elements 10 to 31 and the wiring layers 50 and 54 is the same as that described in the third embodiment. More specifically, the wiring layer 50c is formed such that the semiconductor element 21, the semiconductor element 11 and the semiconductor element 31 are disposed in this order. Similarly, the wiring layer 50d is formed such that the semiconductor element 10, the semiconductor element 30 and the semiconductor element 20 are disposed in this order. Also, the wiring layer 50c and the wiring layer 50d are formed such that they are not overleaped with each other.

FIG. 11A to FIG. 11F each shows the states of ON/OFF of respective semiconductor elements and the arrangement relations thereof when the three-phase AC is produced by the inverter 300. FIG. 12A to FIG. 12F correspond to FIG. 9A to FIG. 9F of the third embodiment, and the semiconductor elements 10 to 31 indicated by the solid lines and the dotted lines in FIG. 11A to FIG. 11F are expressed the same way as FIG. 9A to FIG. 9F. The three-phase AC is generated in such a manner that the states of the respective semiconductor elements 10 to 31 are sequentially switched from the ON/OFF states as indicated in FIG. 11A up to the ON/OFF states as indicated in FIG. 11F.

The fourth embodiment achieves the advantageous effects similar to those achieved by the third embodiment. In addition to the similar effects, the heats generated from the high-heat main faces of semiconductor elements positioned adjacent to each other are mainly radiated to mutually different substrates. Thus, similar to the case where the semiconductor elements are greatly spaced apart from each other at an interval equivalent to about a single unit of semiconductor element, the heats generated by the semiconductor elements are overlapped with each other and interfere with each other while the heats generated therefrom are transferred in the thickness direction of substrates. This can reduce the heat interference where a great amount of heat is generated locally, so that the heat can be more efficiently released.

(Modification 4-1)

Figure 13:
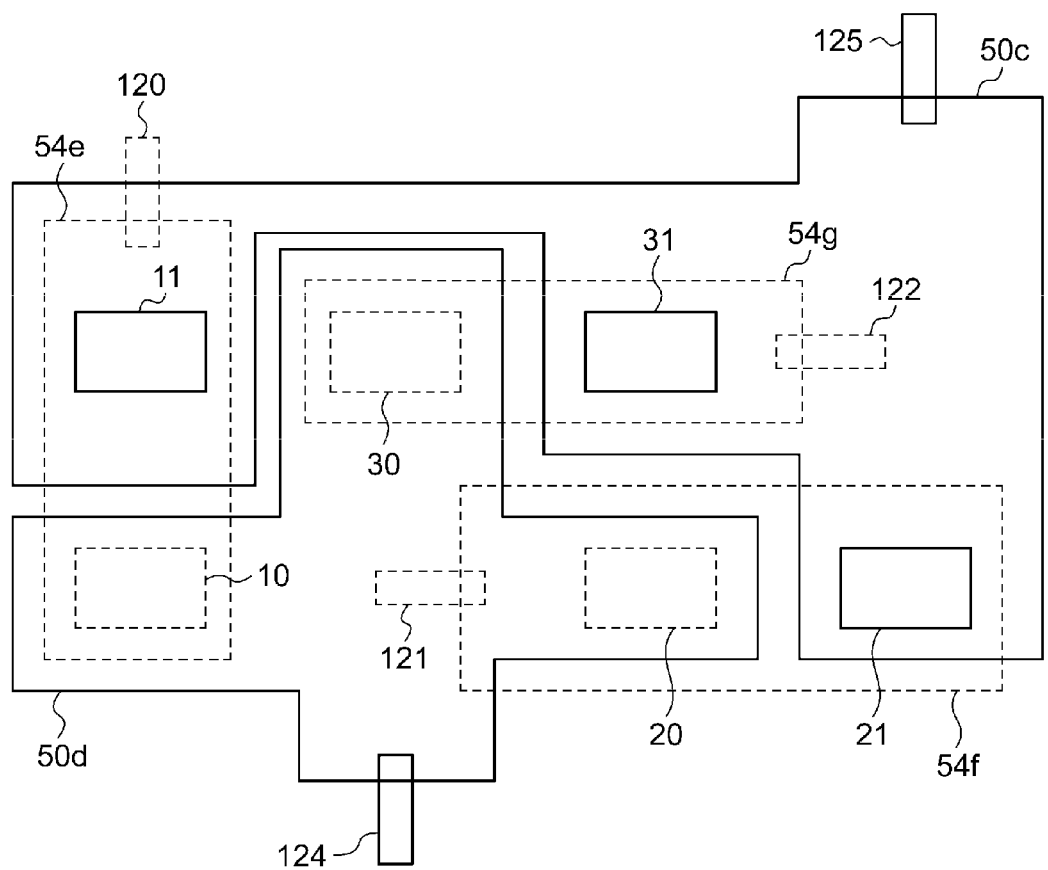
FIG. 13 is a diagram showing a wiring of inverter and an arrangement of semiconductor elements according to a modification of a fourth embodiment.

FIG. 13 shows a wiring of inverter and an arrangement of semiconductor elements according to a modification of the fourth embodiment. In this modification, similar to the fourth embodiment, the semiconductor elements are provided such that the high-heat main face of each semiconductor element faces a substrate that differs from the substrate that its adjacent semiconductor elements face. Note, however, that the arrangement of the semiconductor elements and the shapes of the wiring layers differ from those of the fourth embodiment. More specifically, the wiring layer 50c is formed such that the semiconductor element 11, the semiconductor element 31 and the semiconductor element 21 are disposed in this order. Also, the wiring layer 50d is formed such that the semiconductor element 10, the semiconductor element 30 and the semiconductor element 20 are arranged in this order and are disposed in a V-shape. The modification 4-1 achieves the same operation and advantageous effects as those of the inverter 300 according to the fourth embodiment.

(Modification 4-2)

Figure 14:
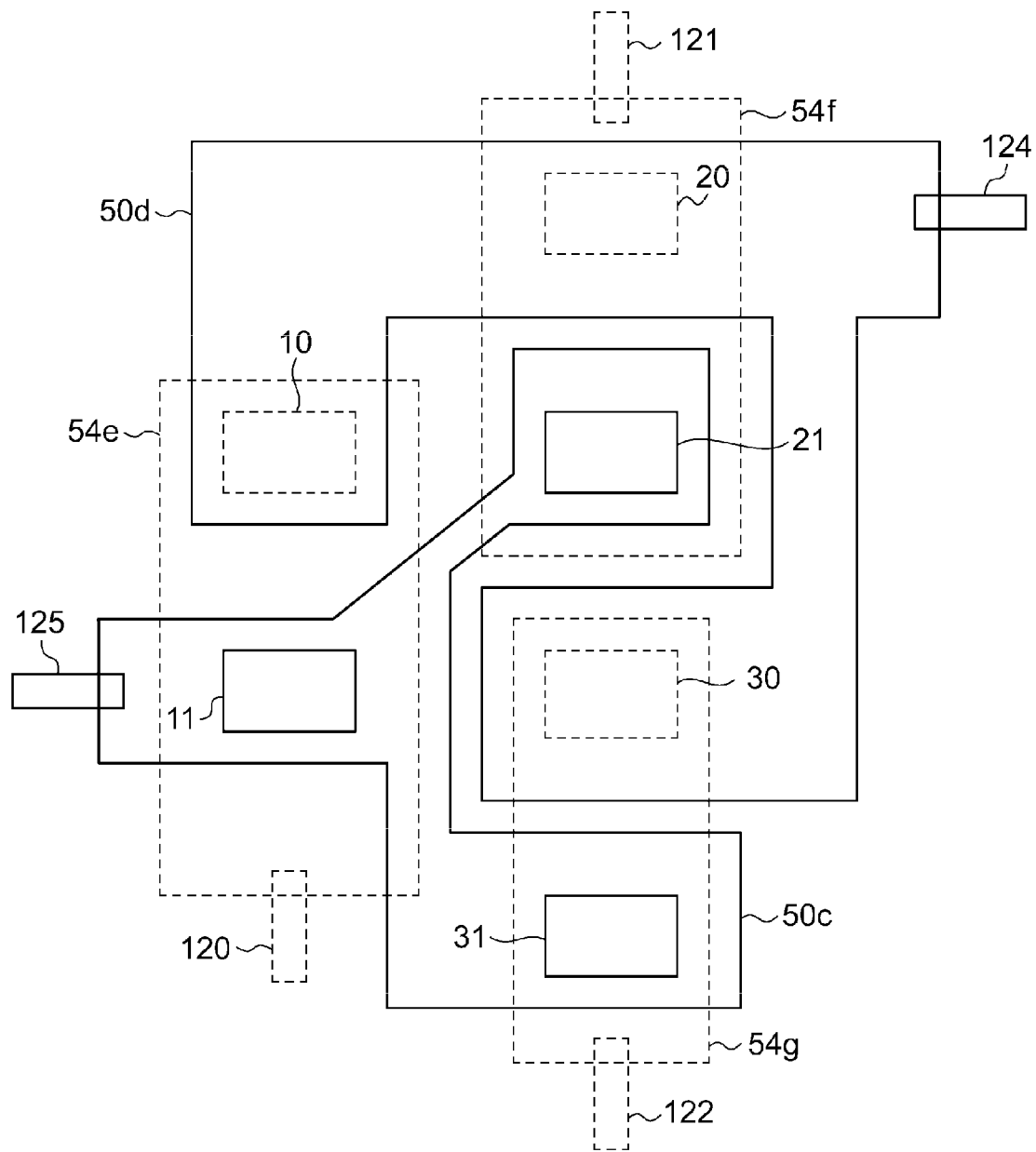
FIG. 14 is a diagram showing a wiring of inverter and an arrangement of semiconductor elements according to another modification of a fourth embodiment.

FIG. 14 shows a wiring of inverter and an arrangement of semiconductor elements according to another modification of the fourth embodiment. In this modification 4-2, too, similar to the fourth embodiment, the semiconductor elements are provided such that the high-heat main face of each semiconductor element faces a substrate that differs from the substrate that its adjacent semiconductor elements face. Note, however, that similar to the modification 4-1 the arrangement of the semiconductor elements and the shapes of the wiring layers differ from those of the fourth embodiment. More specifically, the wiring layer 50c is formed such that the semiconductor element 21, the semiconductor element 11 and the semiconductor element 31 are disposed in this order and are disposed in a V-shape. Also, the wiring layer 50d is formed such that the semiconductor element 10, the semiconductor element 20 and the semiconductor element 30 are arranged in this order and the semiconductor elements 10, and 30 are so configured as to surround the semiconductor element 21. The modification 4-2 achieves the same operation and advantageous effects as those of the inverter 300 according to the fourth embodiment.

Fifth Embodiment

Figure 15:
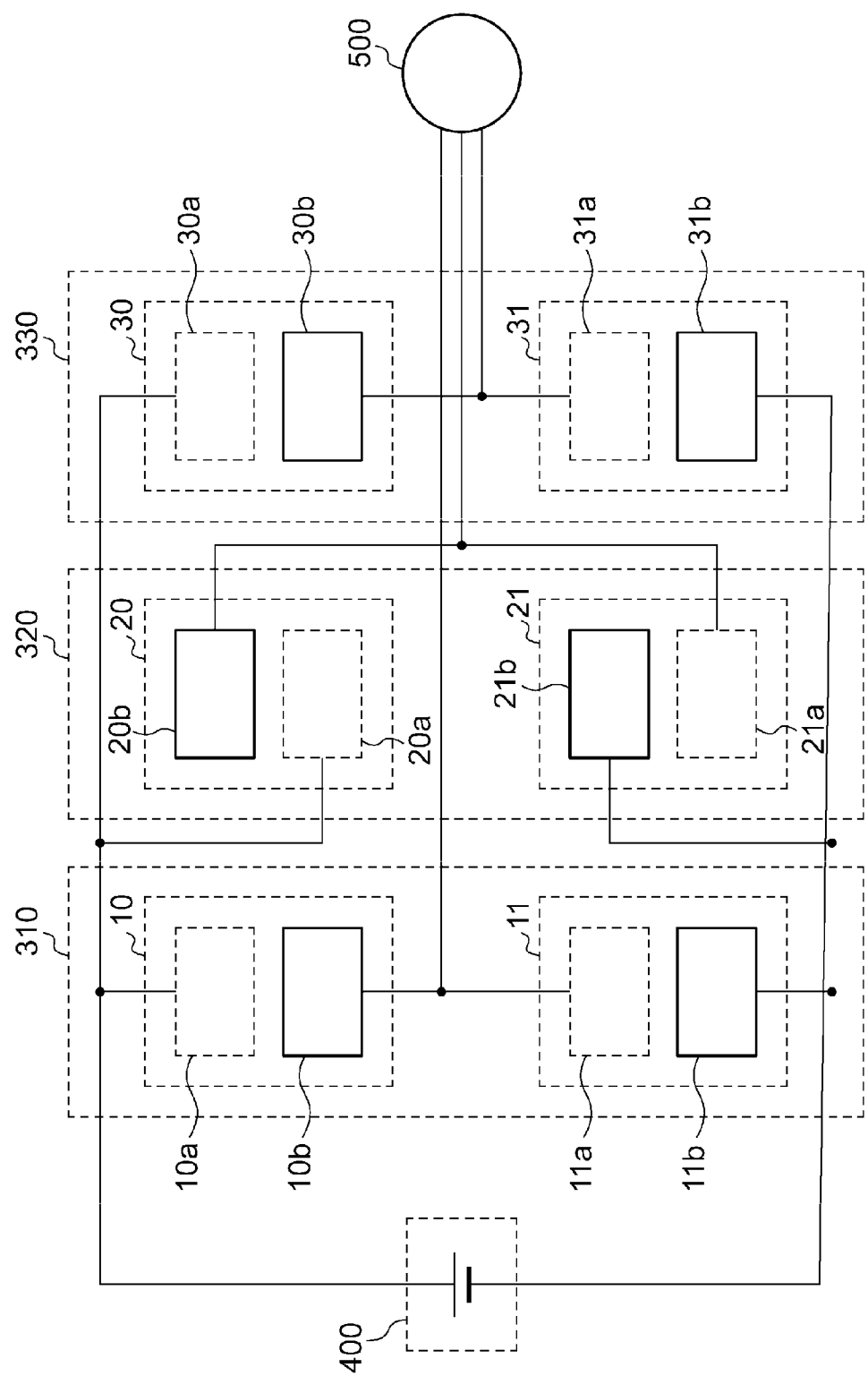
FIG. 15 is a circuit diagram showing a circuit configuration of an inverter according to a fifth embodiment.

FIG. 15 shows a circuit configuration of an inverter 300 according to a fifth embodiment. FIG. 15 corresponds to FIG. 6. In the fifth embodiment, composite semiconductor elements, in each of which normally-on semiconductor element(s) and the normally-off semiconductor element(s) are cascade-connected to each other, are used for the semiconductor elements 10 to 31. Such composite semiconductor elements operate as a normally-off semiconductor element as a whole and have a low on-resistance, which is advantageous all the more.

Figure 16:
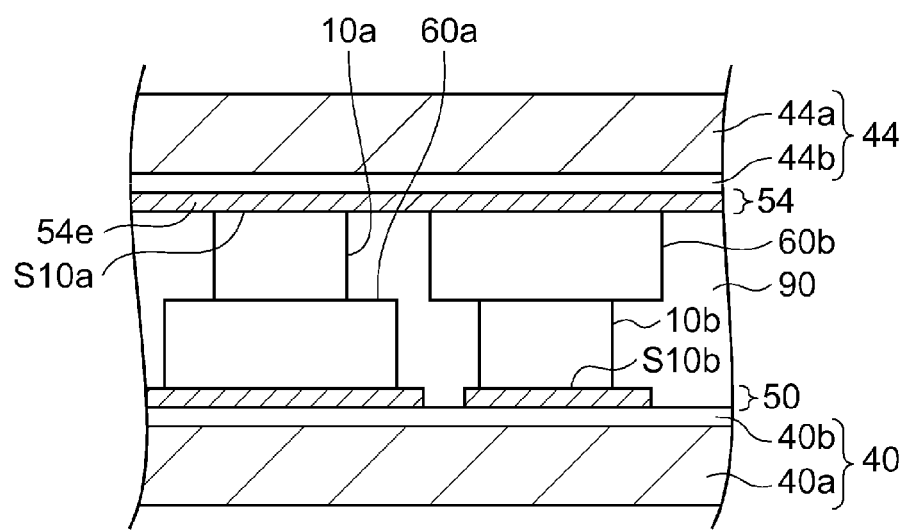
FIG. 16 is a schematic cross-sectional view for explaining composite semiconductor elements used in an inverter according to a fifth embodiment.

FIG. 16 is a schematic cross-sectional view for explaining composite semiconductor elements used in the inverter 300 of FIG. 15. FIG. 16 shows a schematic cross-sectional view of the semiconductor element 10 in the composite semiconductor elements. The structure of each of the semiconductor elements 11 to 31 is similar to that of the semiconductor element 10 and therefore the repeated description thereof is omitted here.

The semiconductor element 10 includes a first semiconductor element 10a and a second semiconductor element 10b. The first semiconductor element 10a is a normally-on semiconductor element, and the second semiconductor element 10b is a normally-off semiconductor element. A high-heat main face S10a of the first semiconductor element 10a faces the substrate 44 and is thermally connected thereto. And the other main face thereof opposite to the main face S10a is in contact with a heat spreader 60a. On the other hand, a high-heat main face S10b of the second semiconductor element 10b faces the substrate 40 and is thermally connected thereto. And the other main face thereof opposite to the main face S10b is in contact with the heat spreader 60a. In other words, the first semiconductor element 10a and the second semiconductor element 10b are configured such that the high-heat main faces thereof face mutually different substrates and are thermally connected to the substrates facing the respective different high-heat main faces thereof. Also, the first semiconductor element 10a and the second semiconductor element 10b are electrically connected to each other through the medium of a wiring layer 54e and a heat spreader 60b. The normally-on semiconductor element as used herein may be SiC-JFET (Junction Field-Effect Transistor), for instance. The normally-off semiconductor element as used herein may be Si-MOSFET (Metal-Oxide-Semiconductor Field-Effect Transistor), for instance. Now, refer back to FIG. 15.

In FIG. 15, the first semiconductor elements 10a, 11a, 20a, 21a, 30a and 31a are normally-on semiconductor elements, whereas the second semiconductor elements 10b, 11b, 20b, 21b, 30b and 31b are normally-off semiconductor elements. The first and second semiconductor elements 10a to 31b indicated by the solid lines and the dotted lines in FIG. 15 are expressed the same way as FIG. 7. As described above, the first semiconductor element 10a and the second semiconductor element 10b constitute the semiconductor element 10. Similarly, a first semiconductor element 11a and a second semiconductor element 11b constitute the semiconductor element 11. A first semiconductor element 20a and a second semiconductor element 20b constitute the semiconductor element 20. A first semiconductor element 21a and a second semiconductor element 21b constitute the semiconductor element 21. A first semiconductor element 30a and a second semiconductor element 30b constitute the semiconductor element 30. A first semiconductor element 31a and a second semiconductor element 31b constitute the semiconductor element 31. As shown in FIG. 15, the second semiconductor elements 10b, 11b, 20b, 21b, 30b and 31b, which are normally-off semiconductor elements, are configured such that the high-heat main faces thereof face the substrate 40 and are thermally connected thereto. Also, the first semiconductor elements 10a, 11a, 20a, 21a, 30a and 31a, which are normally-on semiconductor elements, are configured such that the high-heat main faces thereof face the substrate 44 and are thermally connected thereto.

As shown in FIG. 15, the first and second semiconductor elements are configured such that the high-heat main face of each of the first and second semiconductor elements, including first and second semiconductor elements of different phases, faces a substrate that differs from the substrate that its adjacent semiconductor elements face, and are thermally connected thereto. For example, the first semiconductor element 20a functioning as a V-phase arm is configured such that the high-heat main face thereof faces the substrate 44 and is thermally connected thereto. On the other hand, the second semiconductor elements 20b and 21b, functioning as the V-phase arms as well, which are positioned adjacent to the first semiconductor element 20a, are configured such that the high-heat main face thereof face the substrate 40 and are thermally connected thereto. Also, the second semiconductor elements 10b and 30b, which are of U-phase and W-phase, respectively, and are positioned adjacent to the first semiconductor element 20a, are configured such that the high-heat main faces thereof face the substrate 40 and are thermally connected thereto.

By employing the fifth embodiment, the heats generated from the high-heat main faces of semiconductor elements positioned adjacent to each other are mainly radiated to mutually different substrates. Thus, similar to the case where the semiconductor elements are greatly spaced apart from each other at an interval equivalent to about a single unit of semiconductor element, the heat interference between the semiconductor elements can be reduced. At the same time, the heat generated by the semiconductor element spreads while the heat is transferred in the thickness direction of substrates, so that the heat can be more efficiently radiated.

Also, the high-heat main face of a normally-on semiconductor element and the high-heat main face of a normally-off semiconductor element face mutually different substrates and are thermally connected thereto. In other words, the heat generated from the normally-on semiconductor element and the heat generated from the normally-off semiconductor element are mainly radiated to the mutually different substrates. In general, the normally-on semiconductor element is operable under a high-temperature environment, whereas it is undesirable to operate the normally-off semiconductor element under a high-temperature environment. Since the heat generated from the normally-on semiconductor element and the heat generated from the normally-off semiconductor element are radiated to the mutually different substrates, the normally-off semiconductor element is less likely to be subject to the influence of heat generated from the normally-on semiconductor element. Also, since the heat generated from the normally-on semiconductor element and the heat generated from the normally-off semiconductor element are radiated to the mutually different substrates, it is possible to separately cool the heat generated from the normally-on semiconductor element and the heat generated by the normally-off semiconductor element. In a case, for example, where cooling apparatuses are to be installed separately, they can be simplified, which is advantageous all the more.

Sixth Embodiment

Figure 17:
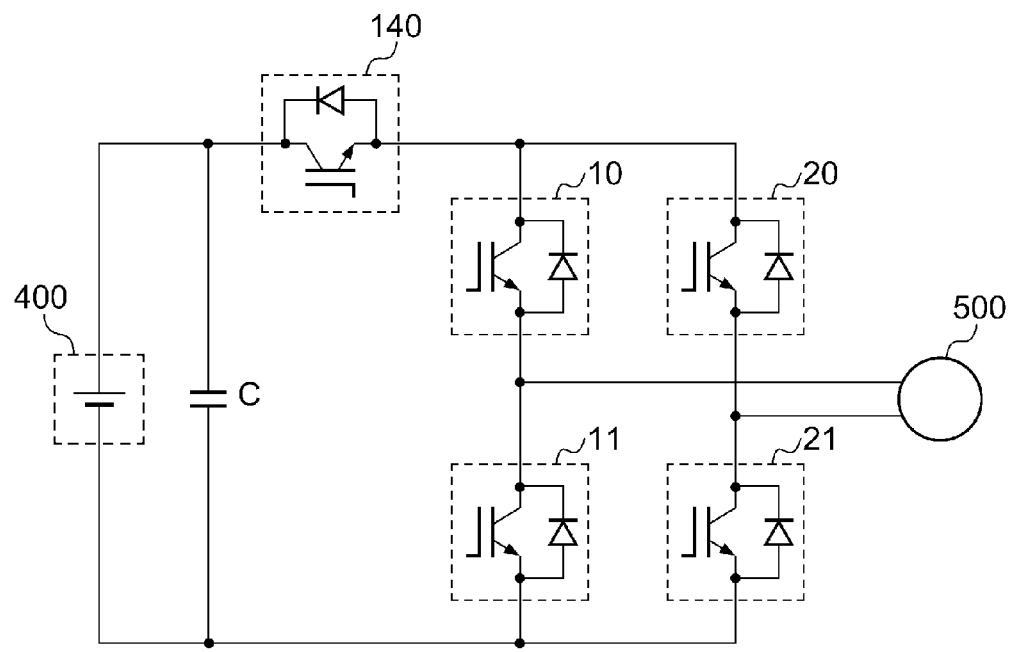
FIG. 17 is a circuit diagram showing a circuit configuration of an inverter according to a sixth embodiment.

FIG. 17 shows a circuit configuration of an inverter 300 according to a sixth embodiment. An inverter system as shown in FIG. 17 is called an "H5" system or "H5" topology in which a fifth semiconductor element 140 is inserted between an input capacitor C and four H-bridge semiconductor elements 10 to 21 in a single-phase inverter. The fifth semiconductor element 140 plays a role of both inhibiting the oscillation of electric charges and reducing the power loss. Accordingly, the H5 system can significantly improve the power conversion efficiency over the conventional bridge circuit for inverter applications. In the H5 system, low-speed operating elements (e.g., a semiconductor element whose operating frequency is 50 Hz) are used for the semiconductor elements 10 and 20. And high-speed operating elements (e.g., a semiconductor element whose operating frequency is 160 kHz) are used for the semiconductor elements 11, 21 and 140. Thus, the adverse effect of heat generated by the highs-speed operating elements on the low-speed operating elements can be reduced by implementing the configuration where the high-heat main face of a low-speed element and the high-heat main face of a high-speed operating element face the mutually different substrates. Furthermore, the overall size of the inverter can be made compact and the efficiency thereof can be enhanced.

Figure 18:
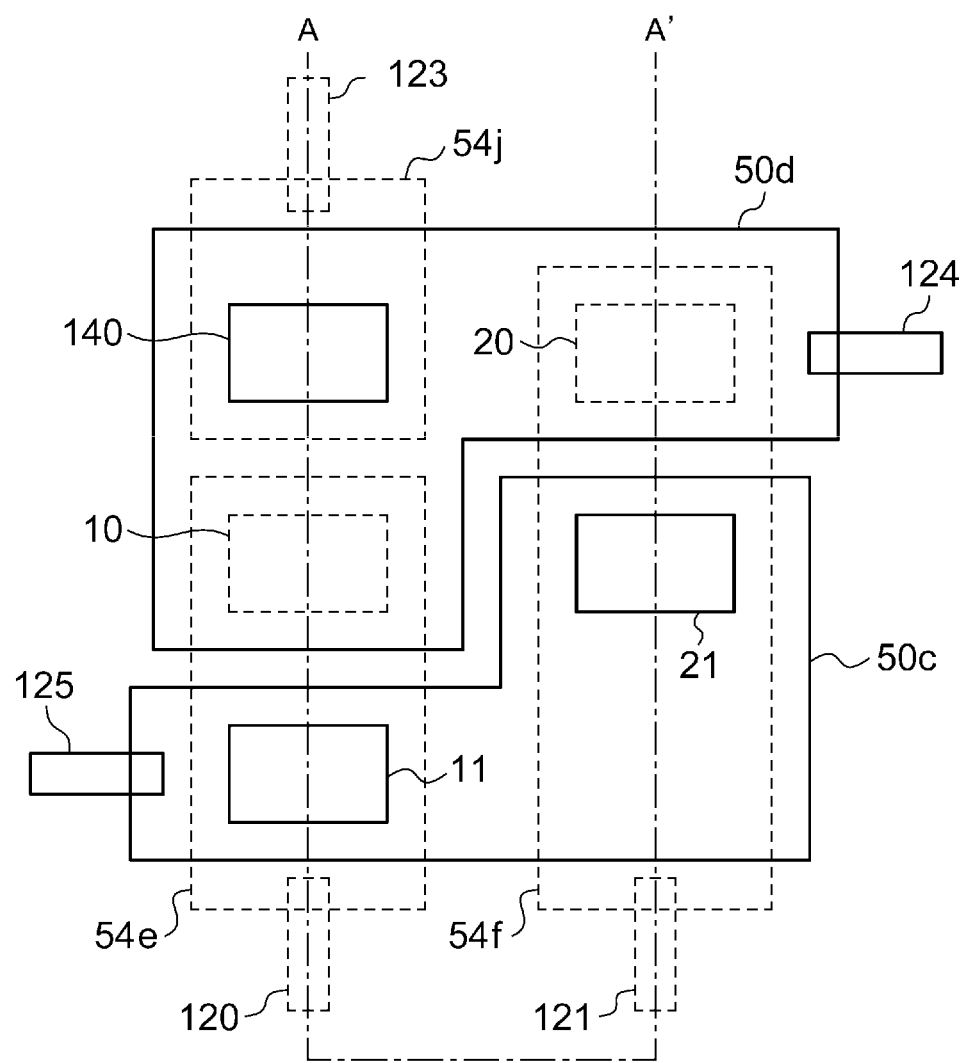
FIG. 18 shows a wiring of inverter and an arrangement of semiconductor elements in a case where the respective high-heat main faces of high-speed operating element and low-speed operating element face mutually different substrates.
Figure 19:
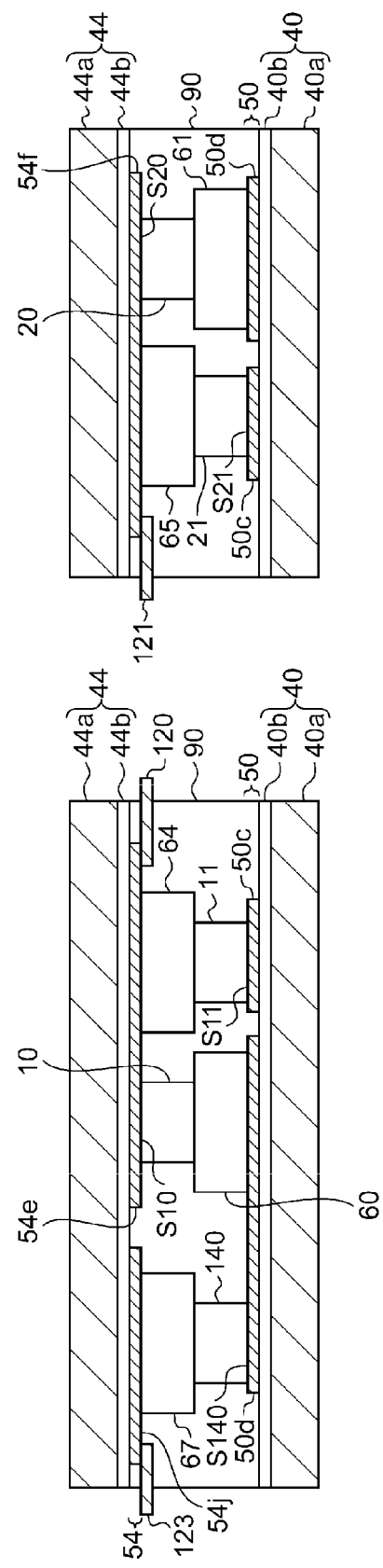
FIG. 19 is a schematic cross-sectional view of an inverter according to a sixth embodiment.

FIG. 18 shows a wiring of the inverter 300 and an arrangement of semiconductor elements in a case where the respective high-heat main faces of high-speed operating element and low-speed operating element face mutually different substrates. The semiconductor elements 10 to 140 indicated by the solid lines and the dotted lines in FIG. 18 are expressed the same way as FIG. 7. FIG. 19 shows a schematic cross-section of the inverter 300 shown in FIG. 18. As shown in FIG. 18 and FIG. 19, the semiconductor elements are configured such that the high-heat main face of each semiconductor element faces a substrate that differs from the substrate that its adjacent semiconductor elements face. The high-heat main faces of the semiconductor elements 11, 21 and 140, which are high-speed operating elements, face the substrate 40 and are thermally connected the substrate 40. And the high-heat main faces of the semiconductor elements 10 and 20, which are low-speed operating elements, face the substrate 44 and are thermally connected to the substrate 44.

By employing the sixth embodiment, the heats generated from the high-heat main faces of semiconductor elements positioned adjacent to each other are mainly radiated to mutually different substrates. Thus, similar to the case where the semiconductor elements are greatly spaced apart from each other at an interval equivalent to about a single unit of semiconductor element, the heat interference between the semiconductor elements can be reduced. At the same time, the heat generated by the semiconductor element spreads while the heat is transferred in the thickness direction of substrates, so that the heat can be more efficiently radiated.

Also, the high-heat main face of a high-speed operating element and the high-heat main face of a low-speed operating element face mutually different substrates and are thermally connected thereto. In other words, the heat generated from the high-speed operating element and the heat generated from the low-speed operating element are mainly radiated to the mutually different substrates. Thereby, the low-speed operating element is less likely to be subject to the influence of heat generated from the high-speed operating element. As a result, the inverter can be made compact-sized and the efficiency thereof can be enhanced.

(Modification 6-1)

Figure 20:
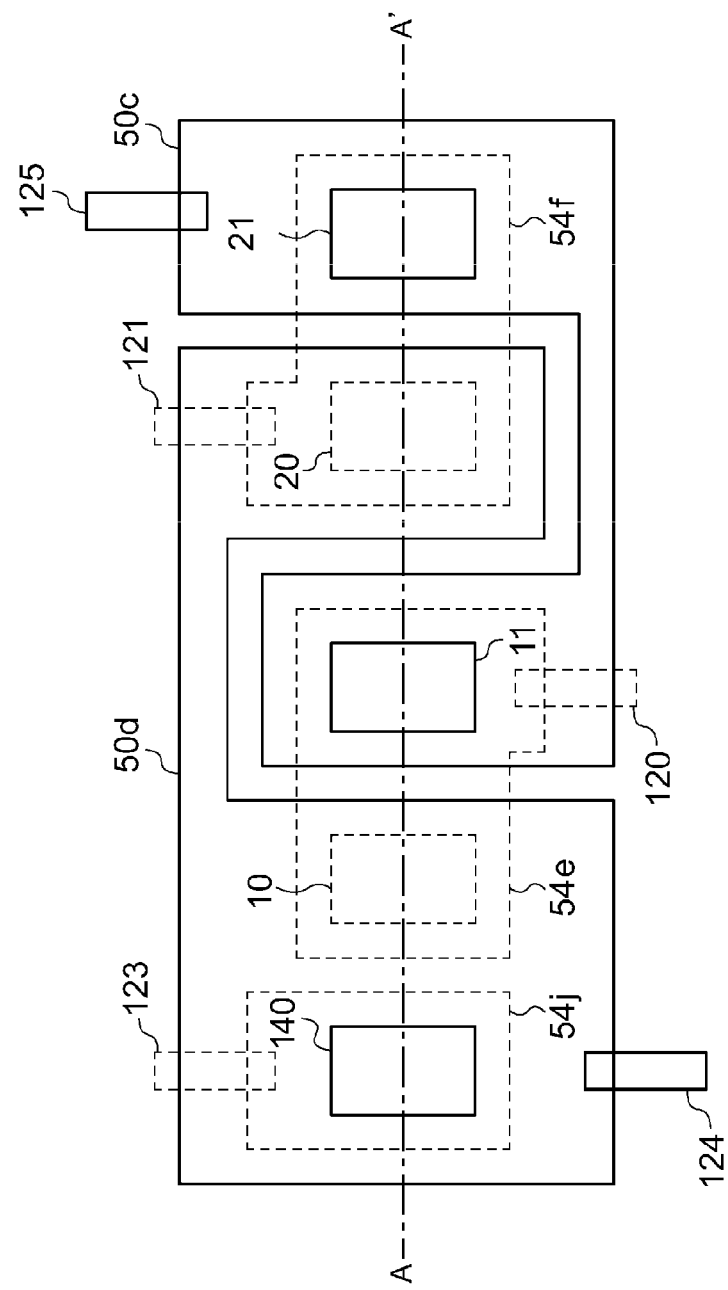
FIG. 20 is a diagram showing a wiring of inverter and an arrangement of semiconductor elements according to a modification of a sixth embodiment.
Figure 21:
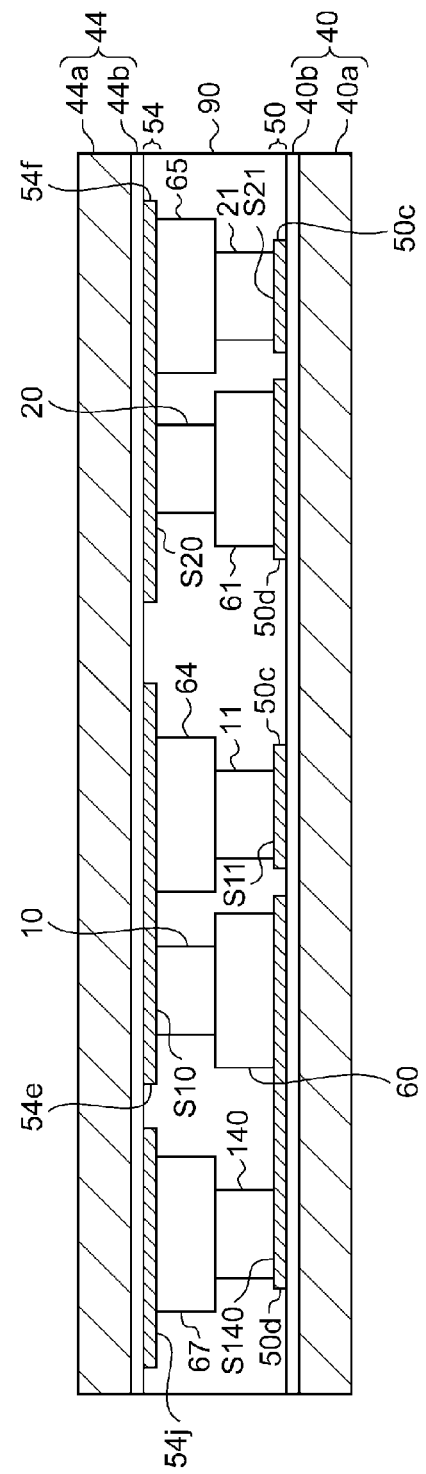
FIG. 21 is a schematic cross-sectional view of an inverter according to a modification of a sixth embodiment.

FIG. 20 shows a wiring of the inverter 300 and an arrangement of semiconductor elements according to a modification of the sixth embodiment. FIG. 20 corresponds to FIG. 18. FIG. 21 shows a schematic cross-section of the inverter 300 shown in FIG. 20. FIG. 21 corresponds to FIG. 19. In the modification 6-1, the semiconductor elements are configured such that the semiconductor element 140, the semiconductor element 10, the semiconductor element 11, the semiconductor element 20, and the semiconductor element 21 are arranged side by side in a row. In this modification 6-1, too, similar to the sixth embodiment, the semiconductor elements are configured such that the high-heat main face of each semiconductor element faces a substrate that differs from the substrate that its adjacent semiconductor elements face. And the high-heat main face of a high-speed operating element and the high-heat main face of a low-speed operating element face mutually different substrates and are thermally connected thereto. The modification 6-1 achieves the same operation and advantageous effects as those of the inverter 300 according to the sixth embodiment.

The present disclosure has been described based on the exemplary embodiments. The exemplary embodiments are intended to be illustrative only, and it is understood by those skilled in the art that various modifications to constituting elements or an arbitrary combination of each process could be further developed and that such modifications are also within the scope of the present disclosure.

In the foregoing embodiments and modifications, an example has been described in which metallic substrates are used as the substrates 40 and 44. However, the present disclosure should not be considered as limiting. For example, one substrate may be an ISB (Integrated System in Board; registered trademark) board or a metal core board where a metallic plate is inserted inside the board. Although, in this case, the thermal conductivity drops and therefore the effect of radiating the heat to the exterior is reduced, a higher degree of integration is achieved. For further details on the ISB boards, see Japanese Unexamined Patent Application Publication (Kokai) No. 2002-110717, for instance.

Figure 22:
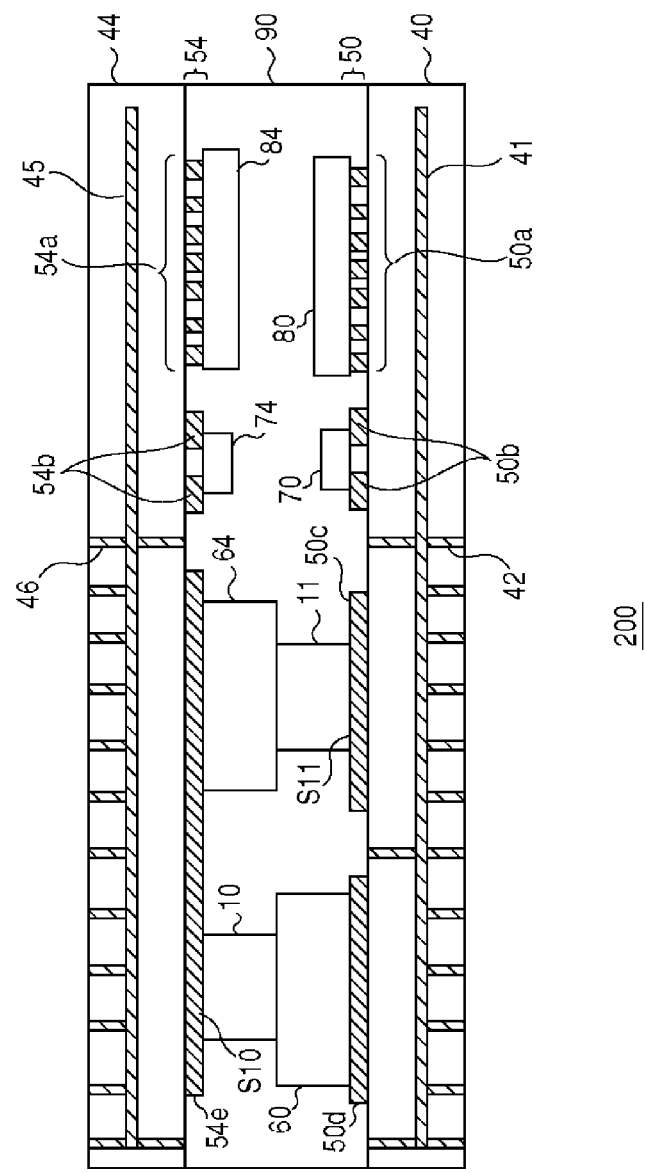
FIG. 22 is a schematic cross-sectional view of a semiconductor module according to a modification of a sixth embodiment.

Also, as shown in FIG. 22, one substrate may be an LTCC (Low Temperature Co-fired Ceramics) board where the metals (e.g., Ag) serving as heatsink layers 41 and 45 and those serving as thermal vias 42 and 46 are simultaneously burnt. In such a case, the thermal vias, which penetrates through the heatsink layers 41 and 45 in the thickness direction of substrates are provided in regions where the wiring layers 50 and 54 are not placed. As a result, the thermal vias can keep their insulation properties and the heat generated by the semiconductor elements is radiated to the exterior.

In the foregoing embodiments and modifications, an example has also been described in which the heat spreaders are provided between the semiconductor elements and the wiring layers. Instead, the configuration may be such that both one main face of each semiconductor element and the other main face thereof are in direct contact with the wiring layers without provision of the heat spreaders.

In the second embodiment, an example has been described in which the heat spreader 60, which is formed in the shape of bellows, is provided between the other main face of each semiconductor element, which is the main face opposite to the high-heat main face thereof, and a wiring layer. Instead, the heat spreader may be provided between the high-heat main face thereof and a wiring layer.

In the second embodiment, an example has also been described in which the heat spreader is an elastic body having the bellows structure. Aside from this, an elastic member may be provided between the semiconductor element and the substrate. In such a case, the elastic member may be located between the semiconductor element and the substrate and therefore the elastic member is not necessarily in direct contact with the semiconductor element and/or the substrate.

In the third and fourth embodiments, an example has been described in which a three-phase inverter having U, V and W phases is used. However, the present disclosure is not limited thereto. For example, it may be a single-phase inverter or a multiple-phase inverter other than the three-phase inverter.

What is claimed is:

1. A semiconductor module comprising:
a first substrate;
a second substrate facing the first substrate;
a first semiconductor element between the first substrate and the second substrate, and having a first face and a second face opposite to the first face, the first semiconductor element containing a heat body on the side of the first face, the first face producing more heat than the second face; and
a second semiconductor element between the first substrate and the second substrate, and having a first face and a second face opposite to the first face, the second semiconductor element containing a heat body on the side of the first face, the first face producing more heat than the second face,
wherein the first face of the first semiconductor element thermally connects to the first substrate,
wherein the first face of the second semiconductor element thermally connects to the second substrate,
wherein the first substrate, the first face of the first semiconductor element, the second face of the first semiconductor element, and the second substrate are arranged in this order, and
wherein the second substrate, the first face of the second semiconductor element, the second face of the second semiconductor element, and the first substrate are arranged in this order.

2. The semiconductor module according to claim 1, further comprising:
a first heat-radiator between the first face of the first semiconductor element and the first substrate; and
a second heat-radiator between the first face of the second semiconductor element and the second substrate.

3. The semiconductor module according to claim 1, further comprising:
a first elastic member between the first face of the first semiconductor element and the first substrate; and
a second elastic member between the first face of the second semiconductor element and the second substrate.

4. The semiconductor module according to claim 1, wherein an electrode of the first semiconductor element and an electrode of the second semiconductor are electrically connected to each other via a wiring layer on one of the first substrate and the second substrate.

5. An inverter including a semiconductor module according to claim 1.

6. The inverter according to claim 5, further comprising a third semiconductor element between the first substrate and the second substrate, and having a first face and a second face opposite to the first face, the third semiconductor element containing a heat body on the side of the first face, the first face producing more heat than the second face, wherein
the first face of the third semiconductor element thermally connects to the second substrate,
the second substrate, the first face of the third semiconductor element, the second face of the third semiconductor element, and the first substrate are arranged in this order,
the first and second semiconductor elements are associated with the same phase, and the third semiconductor element is associated with a phase different from that of the first and second semiconductor elements, and
the first, second, and third semiconductor elements are adjacent to each other.

7. The semiconductor module according to claim 1, further comprising:
a first heat-radiator between the second face of the first semiconductor element and the second substrate; and
a second heat-radiator between the second face of the second semiconductor element and the first substrate.

8. The semiconductor module according to claim 7, wherein the first and second heat-radiators are elastic bodies.

9. The semiconductor module according to claim 1, further comprising:
a first elastic member between the second face of the first semiconductor element and the second substrate; and
a second elastic member between second face of the second semiconductor element and the first substrate.

* * * * *